(12) United States Patent
Manabe

(10) Patent No.: US 9,472,557 B2
(45) Date of Patent: Oct. 18, 2016

(54) MEMORY TRANSISTORS WITH BURIED GATE ELECTRODES

(71) Applicant: PS4 Luxco S.a.r.l., Luxembourg (LU)

(72) Inventor: Kazutaka Manabe, Tokyo (JP)

(73) Assignee: Longitude Semiconductor S.a.r.l., Luxemourg (LU)

( * ) Notice: Subject to any disclaimer, the term of this patent is extended or adjusted under 35 U.S.C. 154(b) by 0 days.

(21) Appl. No.: 14/815,542

(22) Filed: Jul. 31, 2015

(65) Prior Publication Data

US 2015/0340367 A1   Nov. 26, 2015

Related U.S. Application Data

(63) Continuation of application No. 13/595,497, filed on Aug. 27, 2012, now Pat. No. 9,130,009.

(30) Foreign Application Priority Data

Sep. 9, 2011  (JP) ................................. 2011-197082

(51) Int. Cl.
| | |
|---|---|
| *H01L 27/108* | (2006.01) |
| *H01L 29/94* | (2006.01) |
| *H01L 29/66* | (2006.01) |
| *H01L 49/02* | (2006.01) |
| *H01L 29/423* | (2006.01) |
| *H01L 21/74* | (2006.01) |

(52) U.S. Cl.
CPC ....... *H01L 27/10823* (2013.01); *H01L 21/743* (2013.01); *H01L 27/1085* (2013.01); *H01L 27/10805* (2013.01); *H01L 27/10808* (2013.01); *H01L 27/10814* (2013.01); *H01L 27/10847* (2013.01); *H01L 27/10876* (2013.01); *H01L 27/10888* (2013.01); *H01L 28/60* (2013.01); *H01L 28/87* (2013.01); *H01L 28/91* (2013.01); *H01L 29/4236* (2013.01); *H01L 29/66181* (2013.01); *H01L 29/94* (2013.01); *H01L 29/945* (2013.01)

(58) Field of Classification Search
None
See application file for complete search history.

(56) References Cited

U.S. PATENT DOCUMENTS

2010/0240180 A1* 9/2010 Jeon .................. H01L 21/82343
438/239

* cited by examiner

*Primary Examiner* — Fei Fei Yeung Lopez

(57) ABSTRACT

A device includes a semiconductor region surrounded with the isolation region and includes a first active region, a channel region and a second active region arranged in that order in a first direction. A first side portion of the first active region and a second side portion of the second active region faces each other across a top surface of the channel region in the first direction. A gate electrode covers the top surface and the first and second side portions and extends in a second direction that intersects the first direction. A first diffusion layer is formed in the first active region. A second diffusion layer is formed in the second active region. An embedded contact plug is formed in the first active region and extends downwardly from the upper surface of the semiconductor region and contacts with the first diffusion layer.

4 Claims, 27 Drawing Sheets

CROSS SECTION A-A'

CROSS SECTION B-B'

CROSS SECTION C-C'

CROSS SECTION A-A'

CROSS SECTION B-B'

CROSS SECTION C-C'

CROSS SECTION A-A'

CROSS SECTION B-B'

CROSS SECTION C-C'

CROSS SECTION A-A'

CROSS SECTION B-B'

CROSS SECTION C-C'

CROSS SECTION B-B'

CROSS SECTION C-C'

CROSS SECTION A-A'

CROSS SECTION B-B'

CROSS SECTION C-C'

CROSS SECTION A-A'

CROSS SECTION B-B'

CROSS SECTION C-C'

CROSS SECTION A-A'

CROSS SECTION B-B'

CROSS SECTION C-C'

CROSS SECTION B-B'

CROSS SECTION C-C'

CROSS SECTION B-B'

CROSS SECTION C-C'

MEMORY TRANSISTORS WITH BURIED GATE ELECTRODES

CROSS-REFERENCE TO RELATED APPLICATIONS

This application is a continuation of, and claims priority to, U.S. patent application Ser. No. 13/595,497, entitled "Memory Transistors with Buried Gate Electrodes," filed on Aug. 27, 2012, and which claims priority to prior Japanese application JP 2011-197082, each of which are hereby incorporated by reference.

TECHNICAL FIELD

This invention relates to a semiconductor device.

BACKGROUND OF THE INVENTION

In recent years, with the trend of size reduction of semiconductor elements, the size of transistors also tends to be reduced. This trend of size reduction of transistors has made the short channel effect more prominent. For example, in the case of a DRAM (Dynamic Random Access Memory), the channel length of a transistor is reduced with the size reduction of memory cells, whereby the sub-threshold current is increased and the threshold voltage (Vt) of the transistor is reduced. As a result, the performance of the transistor is deteriorated in terms of retention and write characteristics of memory cells.

In order to solve such a problem, there have been developed, for example, a recess (trench) type FET (Field Effect Transistor) in which a groove (trench) is formed in a semiconductor substrate to provide a channel having a three-dimensional structure, as well as a fin type FET in which a fin is formed between grooves to provide a channel having a three-dimensional structure. Both of these types of transistors are able to increase the effective channel length (gate length) and hence to suppress the aforementioned short channel effect. Furthermore, they are able to realize a DRAM having fine memory cells with a minimum feature size of 60 nm or less.

Another type of DRAM has also been proposed to cope with the size reduction of memory cells, in which a buried gate type transistor having a gate electrode buried in the surface layer of a semiconductor substrate is employed as a selection transistor forming a memory cell. This type of DRAM is described, for example, in Japanese Laid-Open Patent Publication Nos. 2006-339476 and 2007-081095.

In a buried gate type transistor, a gate electrode (word line), which is buried in the surface layer of a semiconductor substrate, does not protrude above the surface of the substrate. Thus, only bit lines among wirings connected to the memory cells are located in the upper layer of the semiconductor substrate. This facilitates the layout of capacitors and contact plugs forming the memory cells when they are provided on the semiconductor substrate, and alleviates the difficulty in processing thereof.

Some of related semiconductor devices (DRAMs) are configured, as shown in FIG. 23A and FIG. 23B, such that two memory cells are arranged in each single active region. FIG. 23A is a plan view showing, partially transparently, such a semiconductor device, and FIG. 23B is a cross-sectional view of the semiconductor device taken along the line A-A' in FIG. 23A.

Describing in more detail, this semiconductor device has an element isolation region 104 which is formed by forming an element isolation trench 102 in the surface layer of a semiconductor substrate 101 and burying an element isolation insulating film 103 in the element isolation trench 102, and a plurality of active regions 105 which are isolated from each other by the element isolation region 104.

There are formed, in the surface layer of the semiconductor substrate 101, a plurality of buried gate trenches 106a, 106b so as to extend in a direction Y intersecting with the active regions 105. These buried gate trenches 106a, 106b are arranged side by side in pairs so as to divide the active regions 105.

The semiconductor device has a gate insulating film 107 covering the surfaces of the active regions 105 exposed in the buried gate trenches 106a, 106b, word line wiring layers (word lines) $WL_1'$, $WL_2'$ (gate electrode 108a, 108b) buried in the buried gate trenches 106a, 106b, and a cap insulating film 109 also buried in the buried gate trenches 106a, 106b on top of the word line wiring layers (word lines) $WL_1'$, $WL_2'$. The word line wiring layers $WL_1'$, $WL_2'$ are formed such that they are buried in the buried gate trenches 106a, 106b, respectively, and cross over the active region 105 via the gate insulating film 107. As a result, the two word line wiring layers $WL_1'$, $WL_2'$ crossing the single active region 105 function as gate electrodes 108a, 108b of transistors $Tr_1'$, $Tr_2'$.

The semiconductor device has a first impurity diffusion layer 110 functioning as a drain region of the transistors Tr1', Tr2' in the active region 105b that is located at the center of the three active regions 105a, 105b, 105c divided by the two buried gate trenches 106a, 106b. Further, the semiconductor device has second impurity diffusion layers 111a, 111b functioning as source regions of the transistors Tr1', Tr2' in the active regions 105a, 105c located on the opposite sides. These first and second impurity diffusion layers 110, 111a, 111b are formed by diffusing an impurity into the active regions 105a, 105b, 105c to a depth equivalent to the level of the top faces of the gate electrodes 108a, 108b.

An interlayer insulating film 112 is formed on the semiconductor substrate 101 so as to cover the surface 101a thereof. The first impurity diffusion layer 110 is electrically connected to a bit contact plug 114 buried in a bit contact hole 113 formed in the interlayer insulating film 112. On the other hand, the second impurity diffusion layers 111a, 111b are electrically connected to capacity contact plugs 116a, 116b buried in capacity contact holes 115a, 115b formed in the interlayer insulating film 112.

The semiconductor device has a plurality of bit wiring layers 117 (bit lines BL') located above the surface 101a of the semiconductor substrate 101 and extending in a direction X orthogonal to the word wiring layers WL1', WL2'. Each of these bit lines BL' is electrically connected to the bit contact plug 114 by passing through the central part (active region 105b) of the respective active region 105. Thus, the two transistors Tr1', Tr2' arranged in one active region 105 share one bit line BL'.

The semiconductor device has a plurality of capacitors Ca1', Ca2' formed on the interlayer insulating film 112. These capacitors Ca1', Ca2' are each formed of a lower electrode 118, a capacity insulating film and an upper electrode (both not shown). The lower electrodes 118 are electrically connected to the capacity contact plugs 116a, 116b. Thus, the two transistors Tr1', Tr2' arranged in the one active region 105 form DRAM memory cells MC1', MC2' together with the capacitors Ca1', Ca2'.

As described above, in the related semiconductor device, two transistors Tr1', Tr2' are formed in one active region 105.

Specifically, one of the transistors Tr1' is composed of the gate electrode 108a, the first impurity diffusion layer (drain region) 110, and the second impurity diffusion layer (source region) 111a. The gate electrode 108a is buried in one of the two buried gate trenches 106a, 106b dividing the active region 105, namely in the buried gate trench 106a via the gate insulating film 107. The first impurity diffusion layer (drain region) 110 is formed by diffusing an impurity into the active region 105b located at the center of the three active regions 105a, 105b, 105c divided by the two buried gate trenches 106a, 106b, to a depth equivalent to the level of the top faces of the gate electrodes 108a, 108b. The second impurity diffusion layer (source region) 111a is formed by diffusing an impurity into one of the opposite sides of the three active regions 105a, 105b, 105c, namely into the active region 105a, to a depth equivalent to the top face of the gate electrode 108a.

In one of the transistors, or the transistor Tr1', a channel S1' is formed on three faces consisting of the opposite side faces and the bottom face of the buried gate trench 106a.

Likewise, the other transistor Tr2' is formed to have the gate electrode 108b, the first impurity diffusion layer (drain region) 110, and the second impurity diffusion layer (source region) 111b. The gate electrode 108b is buried in the buried gate trench 106b of the two buried gate trenches 106a, 106b dividing the active region 105. The first impurity diffusion layer (drain region) 110 is as described above. The second impurity diffusion layer (source region) 111b is formed by diffusing an impurity into the other one of the opposite-side active regions of the three active region 105a, 105b, 105c, namely into the active region 105c, to a depth equivalent to the level of the top face of the gate electrode 108b.

In the other transistor Tr2', a channel S2' is formed on three faces consisting of the opposite side faces and the bottom face of the buried gate trench 106b.

However, in the semiconductor device as described above, size reduction of the transistors Tr1', Tr2' sometimes leads to a problem that sufficient ON current cannot be ensured for the transistors Tr1', Tr2' and it becomes difficult to operate the DRAM normally. This is attributable to increased channel resistance of the transistors Tr1', Tr2'.

Further, due to the reduction of the memory cell size, the distance between two memory cells MC1', MC2' arranged in the single active region 105 has become smaller and smaller. This sometimes causes a trouble that when the DRAM is operated, the memory state of one of the adjacent memory cells MC1', MC2' varies depending on the operating state of the other memory cell, resulting in occurrence of disturb error.

For example, it is assumed that data of "0" is stored in one of the two memory cells MC1', MC2' arranged in one active region 105, namely in the memory cell MC1', while data of "1" is stored in the other memory cell MC2'. When ON/OFF operation is repeatedly performed on the transistor Tr1' of the memory cell MC1' in this state, disturb error may occur in the other memory cell MC2' and the data stored therein may be destroyed.

The inventor of this invention has studied possible causes of occurrence of such disturb error and has obtained findings as described below.

In the first place, data of "0" is stored in the memory cell MC1'. Specifically, one of the transistors (transistor Tr1') is turned ON while a low-level potential is applied to the bit line BL'. Thus, the low-level potential is applied to the lower electrode 118 of one of the capacitors (Ca1'). After that, the transistor Tr1' is turned OFF, whereby data of "0" (low-level) is accumulated in the capacitor Ca1'.

Next, data of "1" is stored in the other memory cell MC2'. Specifically, the other transistor Tr2' is turned ON while a high-level potential is applied to the bit line BL'. Thus, the high-level potential is applied to the lower electrode 118 of the other capacitor Ca2'. After that, the other transistor Tr2' is turned OFF, whereby data of "1" (high-level data) is accumulated in the other capacitor Ca2'.

It is assumed that in this state the same operation is repeated on the memory cell MC1' arranged in another active region 105 using the same word line WL1' with the memory cell MC1'. In this manner, the ON/OFF operation is repeated on one of the transistors (Tr1') whereby a high-level potential is repeatedly applied to the word line WL1'.

The inventor has found that, during this operation, electrons (e−) induced in the channel S1' of the transistor Tr1' are sometimes attracted to the second impurity diffusion layer 111b of the adjacent transistor Tr2', as shown in FIG. 23B. This is because a high-level potential is applied to the lower electrode 118 of the capacitor Ca2' where data of "1" is accumulated. The electrons (e−) which have reached the second impurity diffusion layer 111b give a negative charge to the lower electrode 118, whereby the data of "1" (high-level data) accumulated in the other capacitor Ca2' is rewritten to data of "0" (low-level data), resulting in occurrence of disturb error. This is the cause of the disturb error that the inventor has found.

The probability of occurrence of this disturb error is increased in dependence on the number of ON/OFF operations repeated on the transistor Tr1'. In the experiments conducted by the inventor, when the repeated ON/OFF operations were performed on the transistor Tr1', the disturb error occurred at a frequency of about once every 10,000 operations. In this case, destruction of data will occur in about ten memory cells when 100,000 operations are repeated.

Further, little occurrence of disturb error was observed when the distance between the two word wiring layers WL1', WL2' crossing the one active region 105 was relatively large as about 70 nm, but the occurrence of disturb error became more frequent when the distance was reduced to about 50 nm due to reduction of the memory cell size.

The two memory cells MC1', MC2' arranged in the single active region 105 normally must store data independently from each other. However, when the disturb error as described above occurs, normal operation of the semiconductor device (DRAM) is inhibited, resulting in deterioration of reliability thereof.

SUMMARY

In one embodiment, there is provided a device that includes an isolation region formed on a semiconductor substrate. A semiconductor region is surrounded with the isolation region and includes a first active region, a channel region and a second active region arranged in that order in a first direction. The first active region includes a first side portion. The second active region includes a second side portion. The channel region includes a top surface. The first and second side portions faces each other across the top surface in the first direction. A gate electrode covers the top surface and the first and second side portions. The gate electrode extends from the semiconductor region to the isolation region continuously in a second direction that intersects the first direction. The gate electrode includes an upper portion that is concave from upper surfaces both of the semiconductor region and the isolation region. A cap insulator covers the upper portion of the gate electrode. A first diffusion layer is formed in the first active region. A second diffusion layer is formed in the second active region. An embedded contact plug is formed in the first active region and extends downwardly from the upper surface of the semiconductor region and contacts with the first diffusion layer.

In another embodiment, there is provided a device that includes an isolation region formed on a semiconductor substrate. A semiconductor region is surrounded with the isolation region and includes a first active region, a channel region and a second active region arranged in that order in a first direction. The first active region includes a first side portion. The second active region includes a second side portion. The channel region includes a top surface. The first and second side portions faces each other across the top surface in the first direction. A gate electrode covers the top surface and the first and second side portions. The gate electrode extends from the semiconductor region to the isolation region continuously in a second direction that intersects the first direction. A first diffusion layer is formed in the first active region. A second diffusion layer is formed in the second active region. An embedded contact plug is formed in the first active region and extends downwardly from the upper surface of the semiconductor region and contacts with the first diffusion layer. A buried insulator is provided under the embedded contact plug. A top part of the buried insulator comes in contact with a bottom part of the embedded contact plug.

In still another embodiment, there is provided a device includes an isolation region formed on a semiconductor substrate. A semiconductor region is surrounded with the isolation region and includes a first active region, a channel region and a second active region arranged in that order in a first direction. The first active region includes a first side portion. The second active region includes a second side portion. The channel region includes a top surface. The first and second side portions faces each other across the top surface in the first direction. A gate electrode covers the top surface and the first and second side portions. The gate electrode extends from the semiconductor region to the isolation region continuously in a second direction that intersects the first direction. A first diffusion layer is formed in the first active region. A second diffusion layer is formed in the second active region. An embedded contact plug is formed in the first active region and extends downwardly from the upper surface of the semiconductor region and contacts with the first diffusion layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION

Figure 1:
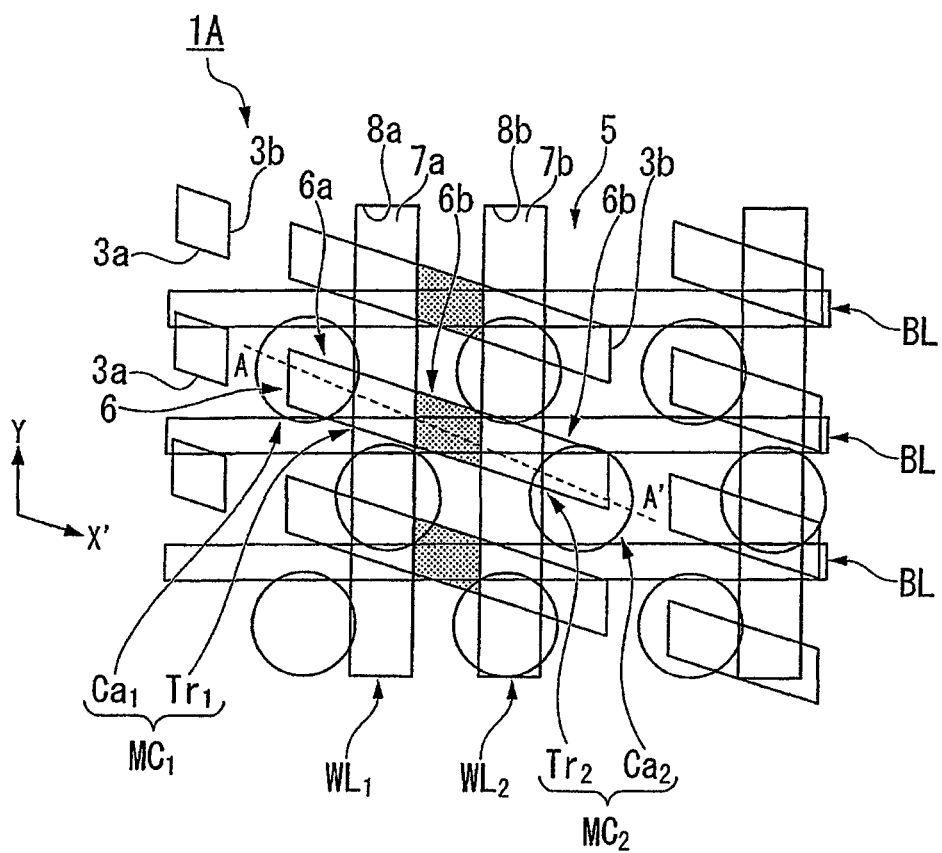
FIG. 1 is a plan view showing, partially transparently, a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device, a manufacturing method thereof, and a data processing system to which the invention is applied will be described in detail with reference to the accompanying drawings.

In the drawings used in the following description, some specific characteristics parts are enlarged for convenience to help understanding of the characteristics, and scale ratios or the like of the components do not necessarily conform to the actual scale ratios or the like. Further, materials and dimensions described below are only illustrative, and the invention is not limited to them. The invention may be modified in various manners without departing from the scope of the invention.

First Embodiment

Semiconductor Device

Figure 2:
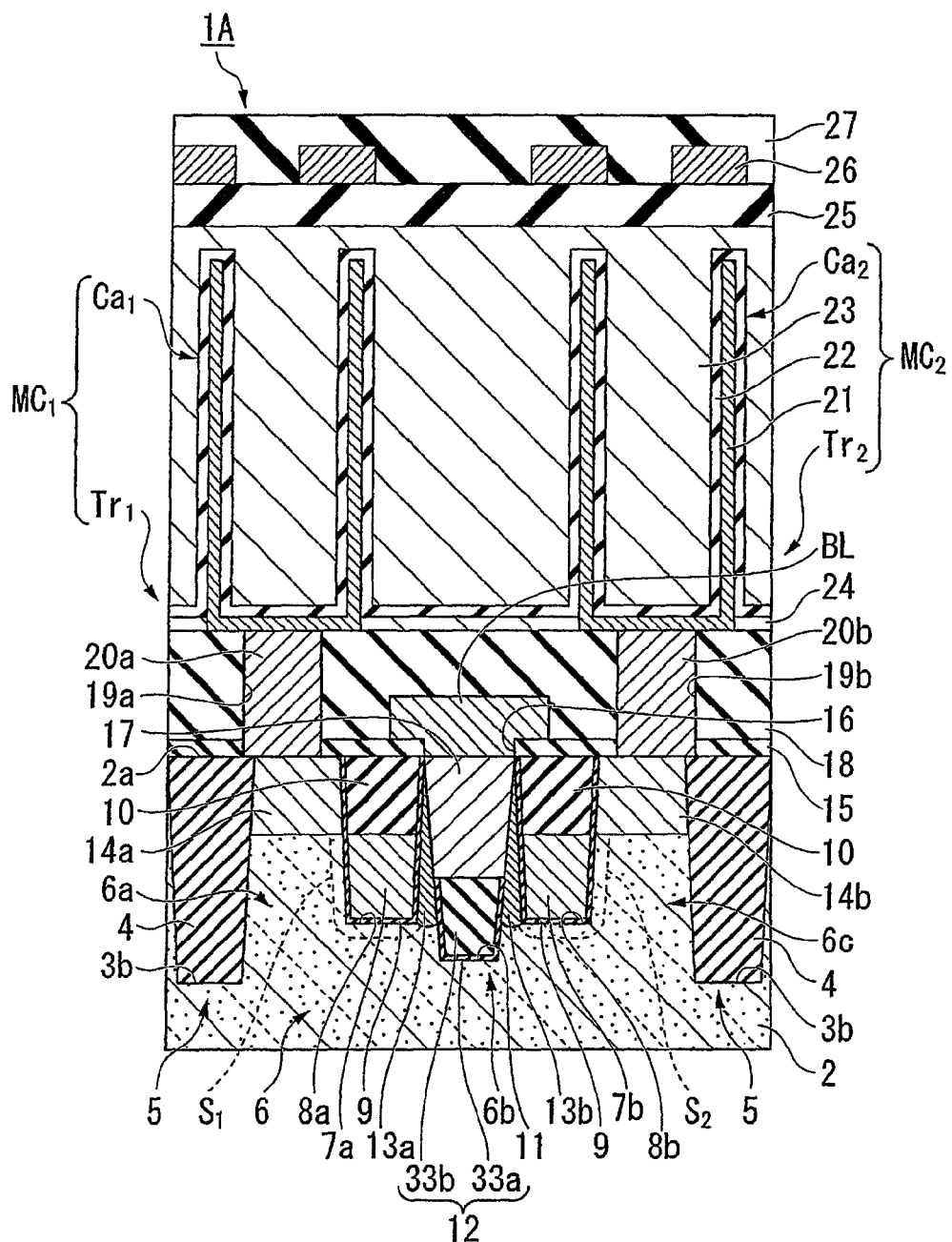
FIG. 2 is a cross-sectional view of the semiconductor device taken along the line A-A' of FIG. 1.
Figure 3A:
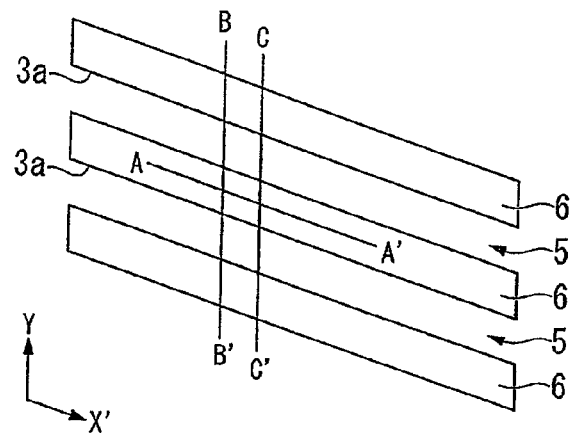
FIG. 3A is a plan view for explaining a manufacturing process of the semiconductor device according to the first embodiment.
Figure 3B:
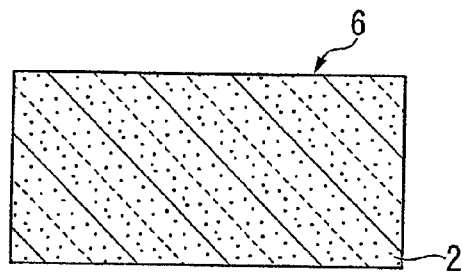
FIG. 3B is a cross-sectional view for explaining the manufacturing process of the semiconductor device according to the first embodiment, taken along the line A-A' of FIG. 3A.
Figure 3C:
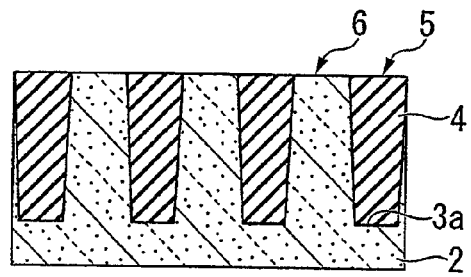
FIG. 3C is a cross-sectional view for explaining the manufacturing process of the semiconductor device according to the first embodiment, taken along the line B-B' of FIG. 3A.
Figure 3D:
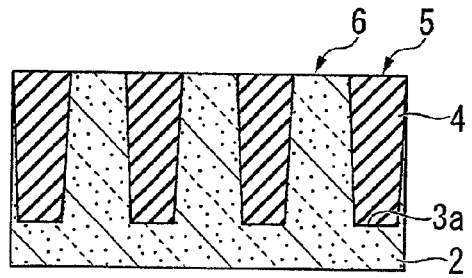
FIG. 3D is a cross-sectional view for explaining the manufacturing process of the semiconductor device according to the first embodiment, taken along the line C-C' of FIG. 3A.
Figure 4A:
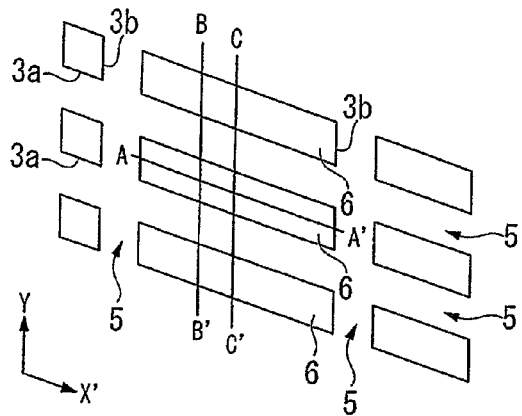
FIG. 4A is a plan view for explaining the manufacturing process of the semiconductor device according to the first embodiment.
Figure 4B:
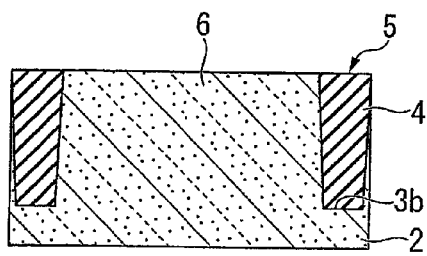
FIG. 4B is a cross-sectional view for explaining the manufacturing process of the semiconductor device according to the first embodiment, taken along the line A-A' of FIG. 4A.
Figure 4C:
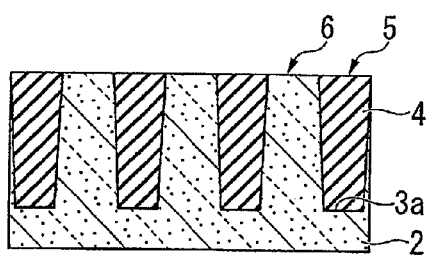
FIG. 4C is a cross-sectional view for explaining the manufacturing process of the semiconductor device according to the first embodiment, taken along the line B-B' of FIG. 4A.
Figure 4D:
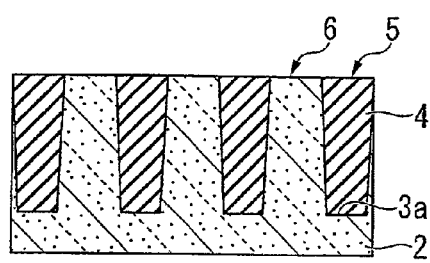
FIG. 4D is a cross-sectional view for explaining the manufacturing process of the semiconductor device according to the first embodiment, taken along the line C-C' of FIG. 4A.
Figure 5A:
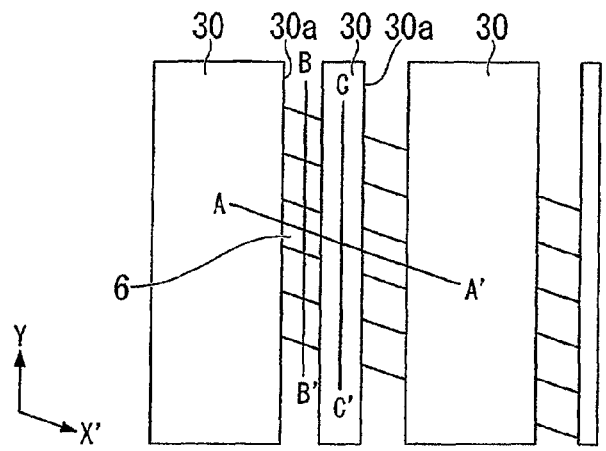
FIG. 5A is a plan view for explaining the manufacturing process of the semiconductor device according to the first embodiment.
Figure 5B:
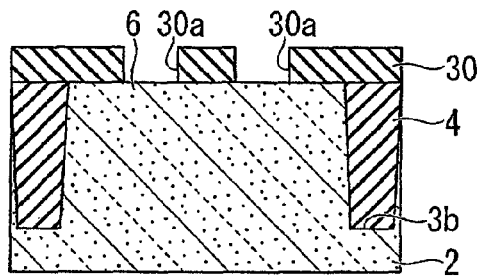
FIG. 5B is a cross-sectional view for explaining the manufacturing process of the semiconductor device according to the first embodiment, taken along the line A-A' of FIG. 5A.
Figure 5C:
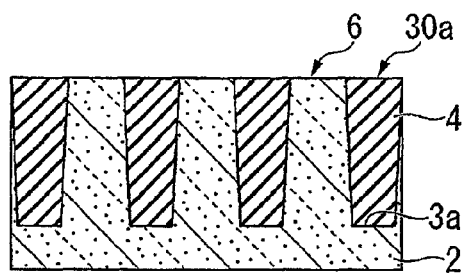
FIG. 5C is a cross-sectional view for explaining the manufacturing process of the semiconductor device according to the first embodiment, taken along the line B-B' of FIG. 5A.
Figure 5D:
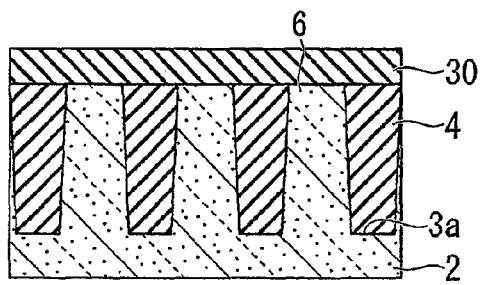
FIG. 5D is a cross-sectional view for explaining the manufacturing process of the semiconductor device according to the first embodiment, taken along the line C-C' of FIG. 5A.
Figure 6A:
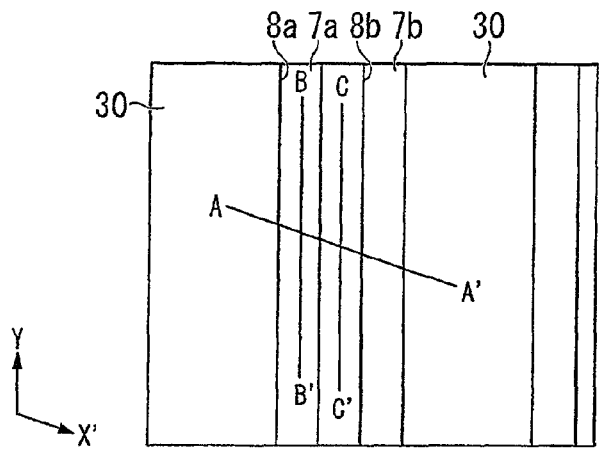
FIG. 6A is a plan view for explaining the manufacturing process of the semiconductor device according to the first embodiment.
Figure 6B:
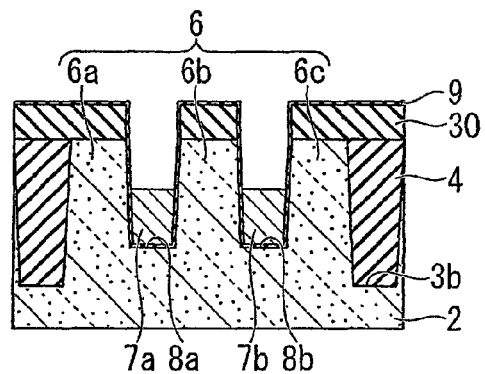
FIG. 6B is a cross-sectional view for explaining the manufacturing process of the semiconductor device according to the first embodiment, taken along the line A-A' of FIG. 6A.
Figure 6C:
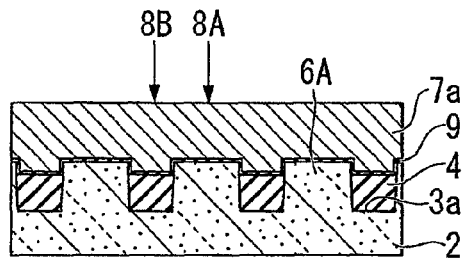
FIG. 6C is a cross-sectional view for explaining the manufacturing process of the semiconductor device according to the first embodiment, taken along the line B-B' of FIG. 6A.
Figure 6D:
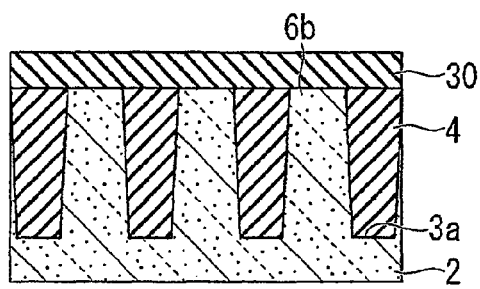
FIG. 6D is a cross-sectional view for explaining the manufacturing process of the semiconductor device according to the first embodiment, taken along the line C-C' of FIG. 6A.
Figure 7A:
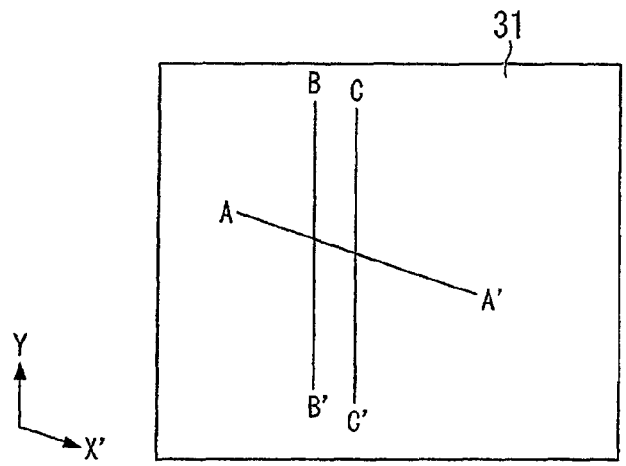
FIG. 7A is a plan view for explaining the manufacturing process of the semiconductor device according to the first embodiment.
Figure 7B:
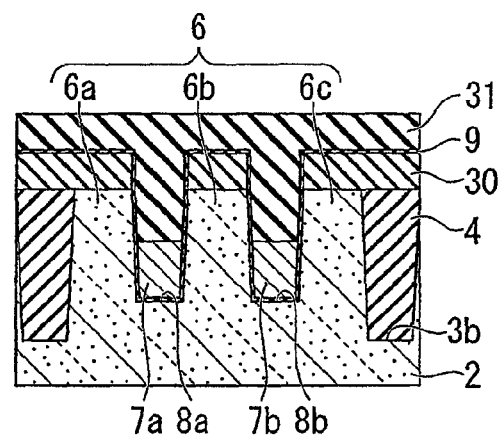
FIG. 7B is a cross-sectional view for explaining the manufacturing process of the semiconductor device according to the first embodiment, taken along the line A-A' of FIG. 7A.
Figure 7C:
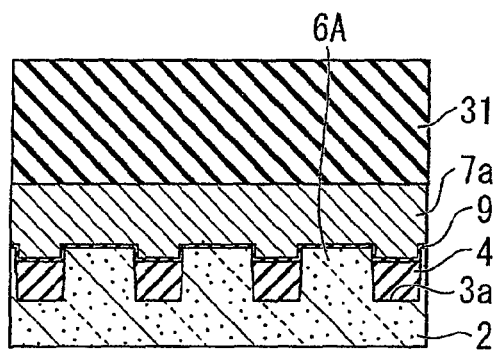
FIG. 7C is a cross-sectional view for explaining the manufacturing process of the semiconductor device according to the first embodiment, taken along the line B-B' of FIG. 7A.
Figure 7D:
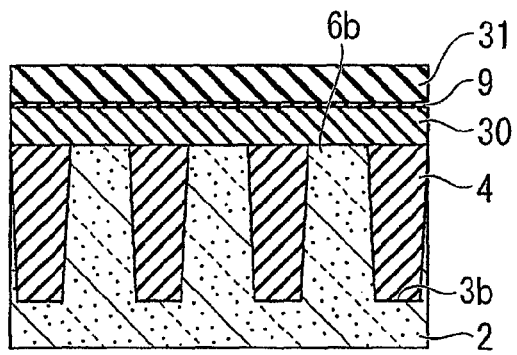
FIG. 7D is a cross-sectional view for explaining the manufacturing process of the semiconductor device according to the first embodiment, taken along the line C-C' of FIG. 7A.
Figure 8A:
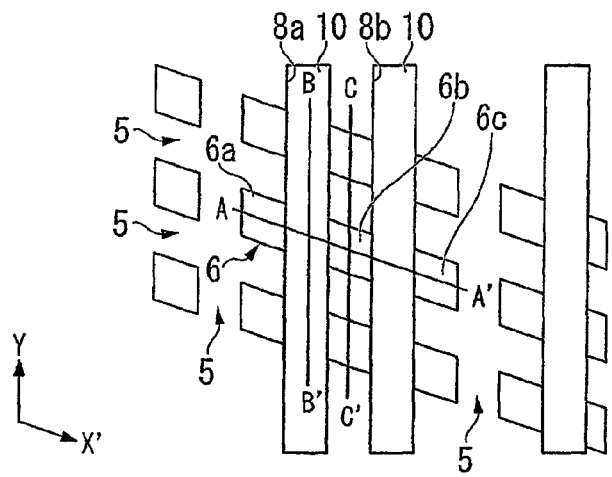
FIG. 8A is a plan view for explaining the manufacturing process of the semiconductor device according to the first embodiment.
Figure 8B:
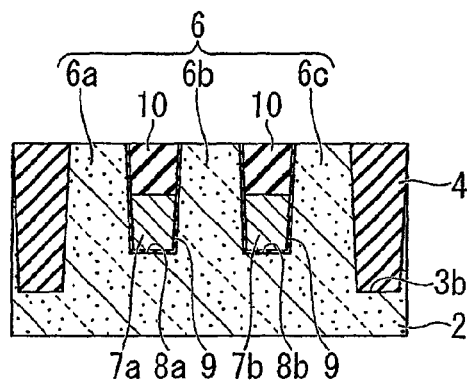
FIG. 8B is a cross-sectional view for explaining the manufacturing process of the semiconductor device according to the first embodiment, taken along the line A-A' of FIG. 8A.
Figure 8C:
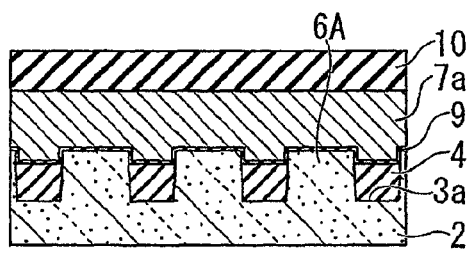
FIG. 8C is a cross-sectional view for explaining the manufacturing process of the semiconductor device according to the first embodiment, taken along the line B-B' of FIG. 8A.
Figure 8D:
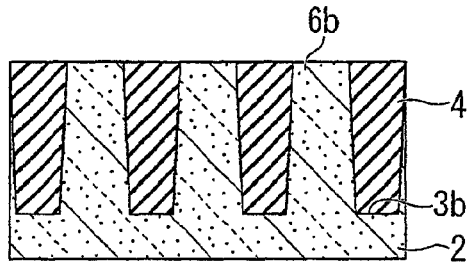
FIG. 8D is a cross-sectional view for explaining the manufacturing process of the semiconductor device according to the first embodiment, taken along the line C-C' of FIG. 8A.
Figure 9A:
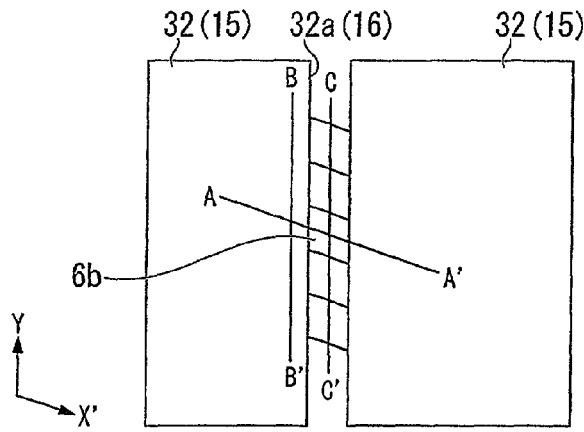
FIG. 9A is a plan view for explaining the manufacturing process of the semiconductor device according to the first embodiment.
Figure 9B:
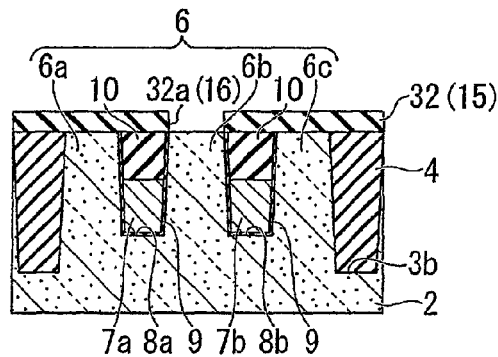
FIG. 9B is a cross-sectional view for explaining the manufacturing process of the semiconductor device according to the first embodiment, taken along the line A-A' of FIG. 9A.
Figure 9C:
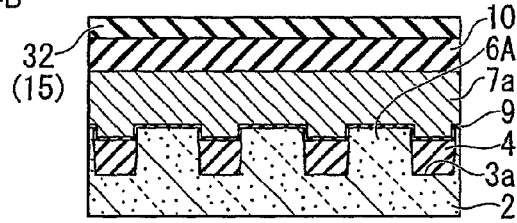
FIG. 9C is a cross-sectional view for explaining the manufacturing process of the semiconductor device according to the first embodiment, taken along the line B-B' of FIG. 9A.
Figure 9D:
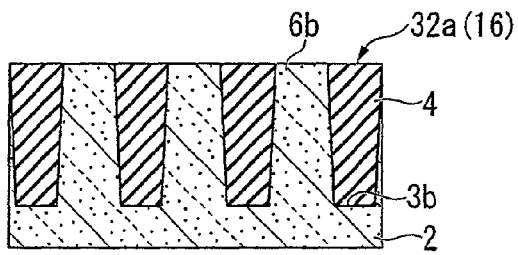
FIG. 9D is a cross-sectional view for explaining the manufacturing process of the semiconductor device according to the first embodiment, taken along the line C-C' of FIG. 9A.
Figure 10A:
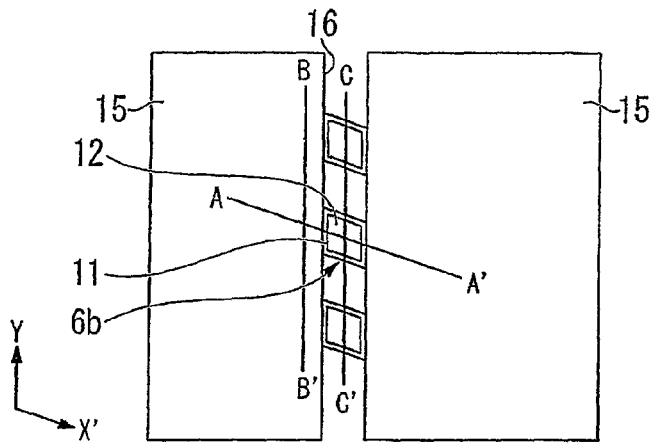
FIG. 10A is a plan view for explaining the manufacturing process of the semiconductor device according to the first embodiment.
Figure 10B:
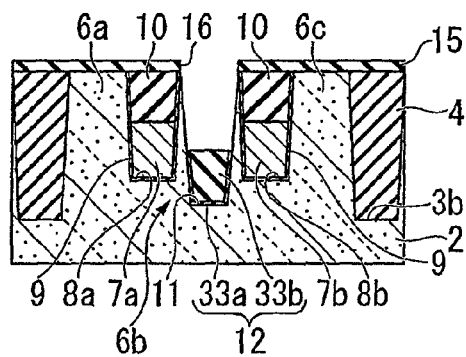
FIG. 10B is a cross-sectional view for explaining the manufacturing process of the semiconductor device according to the first embodiment, taken along the line A-A' of FIG. 10A.
Figure 10C:
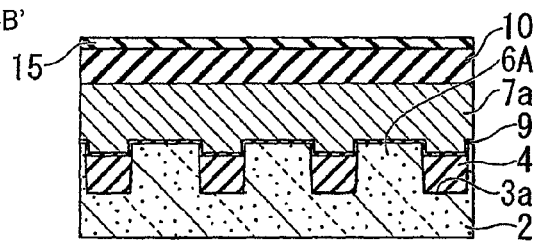
FIG. 10C is a cross-sectional view for explaining the manufacturing process of the semiconductor device according to the first embodiment, taken along the line B-B' of FIG. 10A.
Figure 10D:
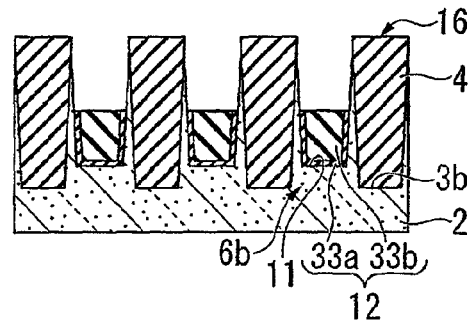
FIG. 10D is a cross-sectional view for explaining the manufacturing process of the semiconductor device according to the first embodiment, taken along the line C-C' of FIG. 10A.
Figure 11A:
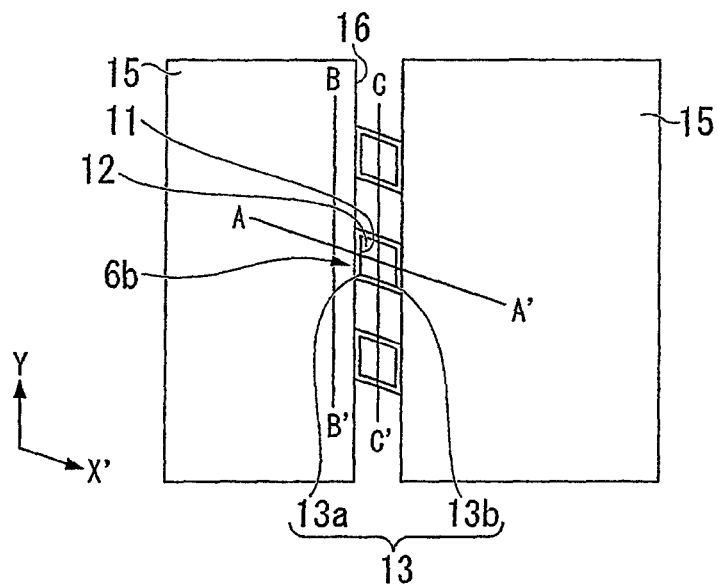
FIG. 11A is a plan view for explaining the manufacturing process of the semiconductor device according to the first embodiment.
Figure 11B:
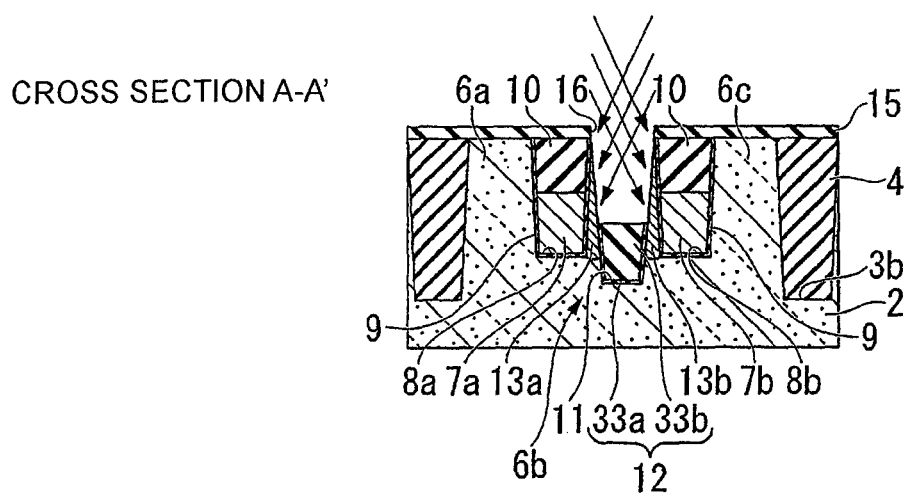
FIG. 11B is a cross-sectional view for explaining the manufacturing process of the semiconductor device according to the first embodiment, taken along the line A-A' of FIG. 11A.
Figure 11C:
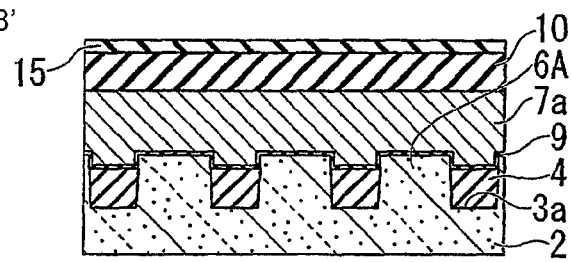
FIG. 11C is a cross-sectional view for explaining the manufacturing process of the semiconductor device according to the first embodiment, taken along the line B-B' of FIG. 11A.
Figure 11D:
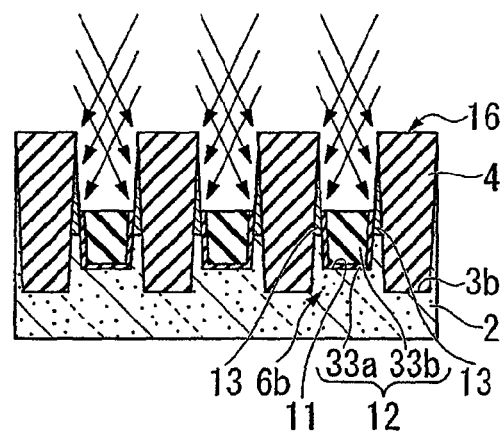
FIG. 11D is a cross-sectional view for explaining the manufacturing process of the semiconductor device according to the first embodiment, taken along the line C-C' of FIG. 11A.
Figure 12A:
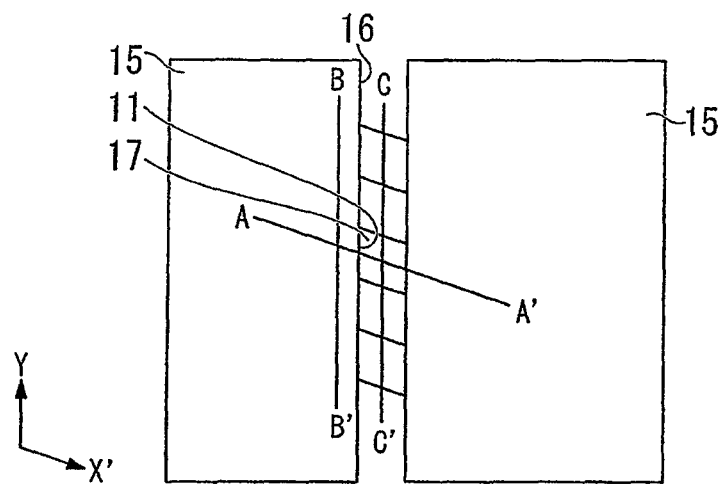
FIG. 12A is a plan view for explaining the manufacturing process of the semiconductor device according to the first embodiment.
Figure 12B:
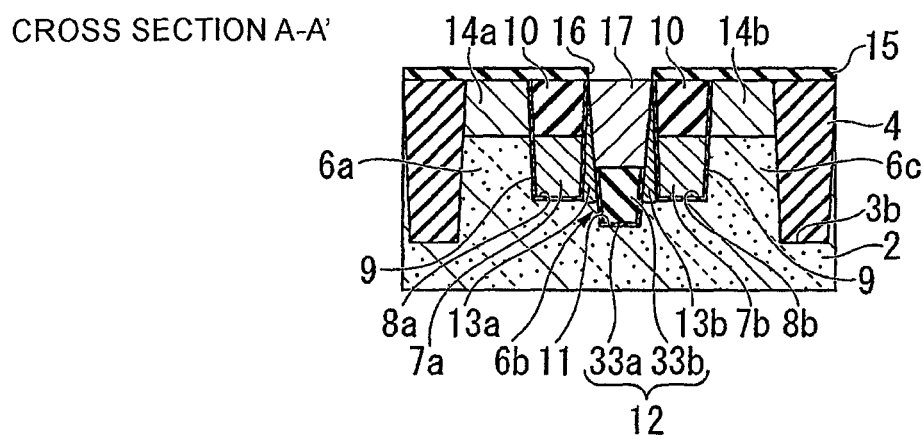
FIG. 12B is a cross-sectional view for explaining the manufacturing process of the semiconductor device according to the first embodiment, taken along the line A-A' of FIG. 12A.
Figure 12C:
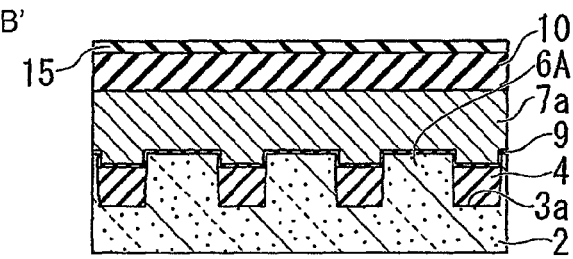
FIG. 12C is a cross-sectional view for explaining the manufacturing process of the semiconductor device according to the first embodiment, taken along the line B-B' of FIG. 12A.
Figure 12D:
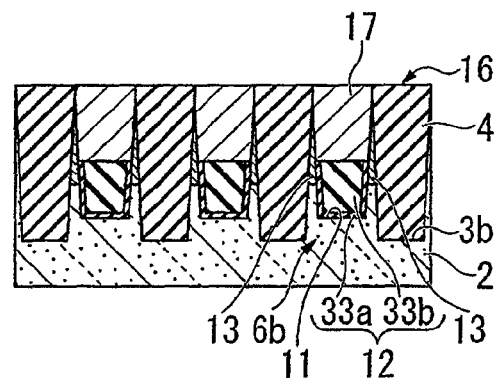
FIG. 12D is a cross-sectional view for explaining the manufacturing process of the semiconductor device according to the first embodiment, taken along the line C-C' of FIG. 12A.
Figure 13A:
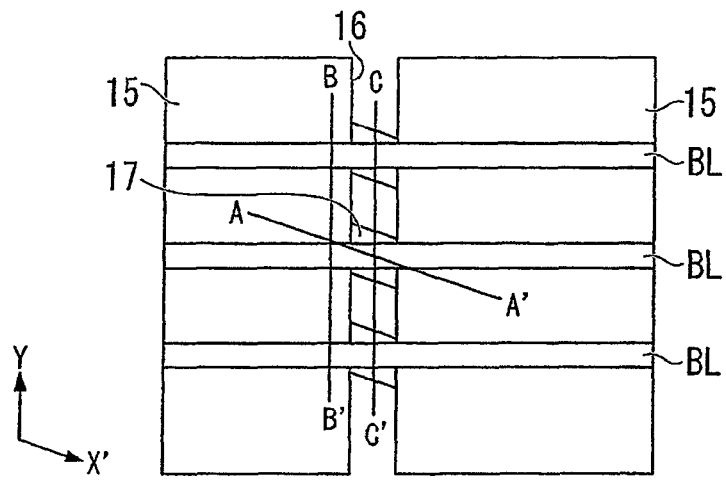
FIG. 13A is a plan view for explaining the manufacturing process of the semiconductor device according to the first embodiment.
Figure 13B:
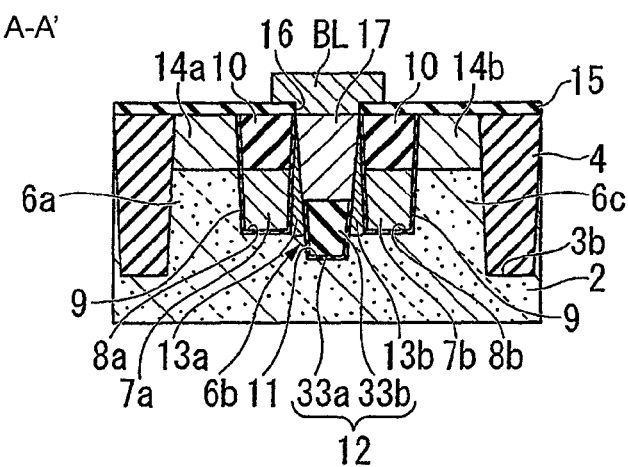
FIG. 13B is a cross-sectional view for explaining the manufacturing process of the semiconductor device according to the first embodiment, taken along the line A-A' of FIG. 13A.
Figure 13C:
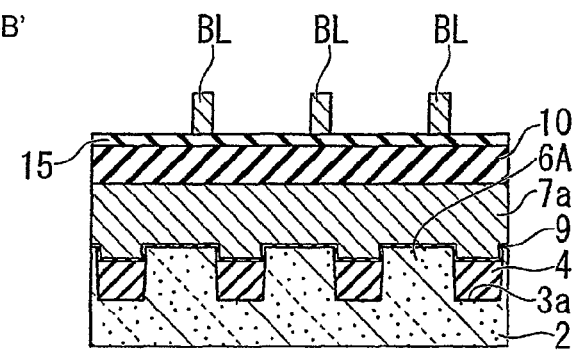
FIG. 13C is a cross-sectional view for explaining the manufacturing process of the semiconductor device according to the first embodiment, taken along the line B-B' of FIG. 13A.
Figure 13D:
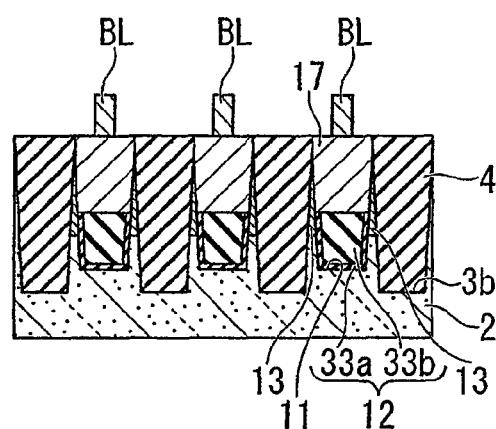
FIG. 13D is a cross-sectional view for explaining the manufacturing process of the semiconductor device according to the first embodiment, taken along the line C-C' of FIG. 13A.

Firstly, a configuration of a semiconductor device 1A shown in FIGS. 1 and 2 will be described as a first embodiment of the invention. FIG. 1 is a plan view showing, partially transparently, the semiconductor device 1A, while FIG. 2 is a cross-sectional view of the semiconductor device 1A taken along the line A-A' of FIG. 1.

The semiconductor device 1A functions as a DRAM in the end. The DRAM has, on a semiconductor substrate, a cell array region in which a plurality of memory cells are arranged in matrix, and a peripheral circuit region which located on the periphery of the cell array region and in which a circuit or the like for controlling operation of the memory cells is formed. FIG. 1 shows a part of the cell array region, and FIG. 2 shows a part including a pair of memory cells MC1, MC2 formed on the semiconductor substrate 2.

The memory cells MC1, MC2 arranged in the cell array region are substantially formed of selection transistors Tr1, Tr2, and capacitors Ca1, Ca2 which are electrically connected to either source or drain of the selection transistors Tr1, Tr2.

Specifically, there are provided, in the cell array region of the semiconductor device 1A, an element isolation region 5 which is formed by forming element isolation trenches 3a, 3b in the surface layer of the semiconductor substrate 2, and burying an element isolation insulating film 4 in these trenches 3a, 3b, and a plurality of semiconductor regions 6 insulated and separated by the element isolation region 5.

The element isolation region 5 is a so-called STI (Shallow Trench Isolation) region. The element isolation region 5 is formed by burying the element isolation insulating film 4 in a trench 3a extending in a first direction X' and a trench 3b extending in a second direction Y intersecting with the first direction X', and isolates the adjacent semiconductor regions 6 from each other. The first direction X' is a direction inclined with respect to the direction X orthogonal to the second direction Y.

The semiconductor region 6 is formed of a part of the semiconductor substrate 2, and is defined into an island shape by the element isolation insulating film 4 (element isolation region 5) buried in the element isolation trenches 3a, 3b. Specifically, the semiconductor region 6 has a rectangular shape as viewed in plan, and extends in the first direction X'. The semiconductor regions 6 are arranged while being spaced from each other in the second direction Y intersecting with the first direction X' and first direction X.

The semiconductor device 1A shown in FIG. 1 employs such a layout that the cell size is 6F2 (F denotes a minimum feature size), and has a configuration in which two (two-bit) memory cells MC1, MC2 are arranged in one semiconductor region 6. Therefore, two selection transistors Tr1, Tr2 are arranged in each of the semiconductor regions 6.

More specifically, a plurality of stripe-shaped word wiring layers (word lines) WL1, WL2 are arranged in the cell array region of this semiconductor device 1A to extend in the second direction Y, while being spaced from each other in a direction orthogonal to the second direction Y. These word wiring layers WL1, WL2 respectively function as gate electrodes 7a, 7b of the selection transistors Tr1, Tr2, and are provided such that two word wiring layers are arranged side by side to cross each the of the semiconductor region 6.

In the selection transistors Tr1, Tr2, the gate electrodes 7a, 7b are located at a lower level than the surface 2a of the semiconductor substrate 2, whereby the selection transistors Tr1, Tr2 have a so-called buried gate type channel structure.

There are formed, in the surface layer of the semiconductor substrate 2, a plurality of buried gate trenches 8a, 8b so as to extend in a (second) direction Y intersecting with the semiconductor regions 6. These buried gate trenches 8a, 8b are arranged side by side in pairs so as to divide the semiconductor regions 6.

The semiconductor region 6 is divided into three active regions 6a, 6b, 6c by two buried gate trenches 8a, 8b. Regions located between a first active region 6b located at the center of the three active regions, and second active regions 6a, 6c located on the opposite sides, that is, regions located below the buried gate trenches 8a, 8b are sometimes called channel regions. The first active region 6b and each of the second active regions 6a, 6c respectively have a first side and a second side facing each other across the top faces of the channel regions.

The semiconductor device has a gate insulating film 9 covering the surfaces of the semiconductor regions 6 exposed in the buried gate trenches 8a, 8b, word line wiring layers (word lines) WL1, WL2 buried in the buried gate trenches 8a, 8b, and a cap insulating film 10 also buried in the buried gate trenches 8a, 8b on top of the word line wiring layers (word lines) WL1, WL2. The word line wiring layers WL1, WL2 are formed such that they are buried in the buried gate trenches 8a, 8b, respectively, and cross over the semiconductor region 6 via the gate insulating film 9. As a result, the two word line wiring layers WL1, WL2 crossing the single semiconductor region 6 function as gate electrodes 7a, 7b of the selection transistors Tr1, Tr2. In other words, the gate electrodes 7a, 7b extend from the semiconductor region 6 to the element isolation region 5 along the second direction, and cover the first side of the first active layer 6b and the second sides of the second active layers 6a, 6c via the gate insulating film 9. The top faces of the gate electrodes 7a, 7b are located at a lower level than the top faces of the semiconductor region 6 and element isolation region 5. Further, the top faces of the gate electrodes 7a, 7b are protected by the cap insulating film 10 provided in a state buried in the buried gate trenches 8a, 8b.

There is formed, in the surface layer of the semiconductor substrate 2, a bit contact trench 11 extending in the direction (second direction) Y parallel to the buried gate trenches 8a, 8b. The bit contact trench 11 is formed deeper than the buried gate trenches 8a, 8b so as to divide the first active region 6b.

An insulating film 12 (a liner insulating film 33a and a buried insulating film 33b) is buried in the bit contact trench 11 and has such a thickness that the top face thereof is located at a higher level than the bottom faces of the buried gate trenches 8a, 8b. This insulating film 12 isolates the selection transistors Tr1, Tr2 which are adjacent to each other across the bit contact trench 11.

A bit contact plug 17 is formed and buried in the bit contact trench 11 such that the bottom face thereof is in contact with the top face of the insulating film 12. The bit contact plug 17 has continuous side faces which are inclined at a substantially constant angle.

Further, first impurity diffusion layers 13a, 13b functioning as drain regions of the selection transistors Tr1, Tr2 are provided on the opposite sides of the bit contact trench 11 having the insulating film 12 buried therein. The first impurity diffusion layers 13a, 13b are formed by diffusing an impurity into the opposite sides of the bit contact trench 11 from the top face of the first active region 6b (the surface 2a of the semiconductor substrate 2) to a depth equivalent to the level of the bottom faces of the buried gate trenches 8a, 8b.

The widths of the buried gate trenches 8a, 8b and the bit contact trench 11 are gradually reduced toward the bottom faces thereof. Therefore, each of the first impurity diffusion layers 13a, 13b has a shape in which the width between the buried gate trench 8a or 8b and the bit contact trench 11 is gradually increased downward from the surface 2a of the semiconductor substrate 2. In other words, each of the first impurity diffusion layers 13a, 13b is arranged between the bit contact plug 17 and the gate electrodes 7a, 7b, and its width in the first direction is gradually increased from the surface 2a of the semiconductor substrate 2 downward. The bottom face of the contact plug 17 is located at a higher level than the lower parts of the first impurity diffusion layers 13a, 13b, and the top face of the contact plug 17 is located at the same level as the cap insulating film 10.

There are provided, in the second active regions 6a, 6c located on the opposite sides of the first active region 6b, second impurity diffusion layers 14a, 14b functioning as source regions of the selection transistors Tr1, Tr2. These second impurity diffusion layers 14a, 14b are formed by diffusing an impurity into the respective active regions 6a, 6c from the top faces of the second active regions 6a, 6c (the surface 2a of the semiconductor substrate 2) to a depth equivalent to the level of the top faces of the gate electrodes 7a, 7b.

A first interlayer insulating film 15 is provided on the semiconductor substrate 2 to cover the entire surface thereof. The first impurity diffusion layer 13a is electrically connected to the bit contact plug 17 buried in the bit contact trench 11 and in a bit contact hole 16 formed in the first interlayer insulating film 15. In other words, the bit contact plug 17 is surrounded by the first impurity diffusion layer 13a and the side faces thereof are in contact with the first impurity diffusion layer 13a. The bottom of the bit contact plug 17 is in contact with the top of the insulating film 12.

The bit contact plug 17 is electrically connected to a bit wiring layer (bit line) BL formed directly above the bit contact plug 17. This bit wiring layer BL is located at a higher level than the surface 2a of the semiconductor substrate 2. The bit wiring layer BL is formed in plurality in a striped shape extending in a direction X orthogonal to the word wiring layers WL1, WL2. The bit wiring layers BL are arranged while being spaced from each other in a direction (second direction) Y in which the word wiring layers WL1, WL2 extend. These bit wiring layers BL are electrically connected to the bit contact plug 17 by sequentially passing through the central parts (the first active region 6b) of the respective semiconductor regions 6. Thus, the two transistors Tr1, Tr2 arranged in one semiconductor region 6 share one bit wiring layer BL.

A second interlayer insulating film 18 is provided on the first interlayer insulating film 15 to cover the entire surface thereof. The second impurity diffusion layers 14a, 14b are electrically connected to capacity contact plugs 20a, 20b buried in capacity contact holes 19a, 19b passing through the first and second interlayer insulating films 15, 18.

Further, the capacity contact plugs 20a, 20b are electrically connected to capacitors Ca1, Ca2 formed directly above the capacity contact plugs 20a, 20b. The capacitors Ca1, Ca2 are each composed of a lower electrode 21, a capacity insulating film 22, and an upper electrode 23 which are stacked in this order.

The lower electrodes 21 are positioned directly above the respective capacity contact plugs 20a, 20b and have a bottomed cylindrical crown shape. The lower electrodes 21 are isolated from each other by a third interlayer insulating film 24 interposed therebetween. The capacity insulating film 22 is formed to cover the surfaces of the lower electrode 21 and third interlayer insulating film 24. The upper electrode 23 is formed on the entire surface to cover the capacity insulating film 22 and to fill the inner spaces of the lower electrodes 21.

The capacitors Ca1, Ca2 need not necessarily be of a crown type using the inner surfaces and outer peripheral surfaces of the lower electrodes 21 as electrodes. The structure of the capacitors Ca1, Ca2 is not restricted particularly, and may be a cylinder type using the inner surfaces of the lower electrodes 21 but not using the outer peripheral surfaces as electrodes.

There are provided, on the upper electrode 23, a fourth interlayer insulating film 25 to cover the entire surface thereof, an upper wiring layer 26 formed on the fourth interlayer insulating film 25, and a surface protection film 27 covering the upper wiring layer 26.

In this manner, a DRAM having a plurality of memory cells MC1, MC2 in the cell array region is formed.

The semiconductor device 1A having the configuration as described above operates as a DRAM which is capable of perform operation to store information by determining whether or not electrical charge is accumulated in the capacitors Ca1, Ca2 while repeating ON/OFF operations on the selection transistors Tr1, Tr2.

The semiconductor device 1A is configured to be able to ensure sufficient ON current for the two selection transistors Tr1, Tr2 arranged in the one semiconductor region 6, and yet to prevent occurrence of interference of operation between the two selection transistors Tr1, Tr2.

Specifically, the transistor Tr1 is configured to have a gate electrode 7a, a first impurity diffusion layer (drain region) 13a, and a second impurity diffusion layer (source region) 14a. The gate electrode 7a is buried in one of the two buried gate trenches 8a, 8b dividing the semiconductor region 6, that is, in the buried gate trench 8a with the gate insulating film 9 interposed therebetween. The first impurity diffusion layer (drain region) 13a is formed by diffusing an impurity into the one of the side faces of the bit contact trench 11 dividing the first active region 6b located at the center of the three active regions 6a, 6b, 6c divided by the buried gate trenches 8a, 8b, to a depth equivalent to the level of the bottom face of the buried gate trench 8a. The second impurity diffusion layer (source region) 14a is formed by diffusing an impurity into one of the two second active regions 6a, 6c on the opposite sides of first active region 6b (active region 6a) into a depth equivalent to the level of the top face of the gate electrode 7a.

In the transistor Tr1, a channel S1 is formed over the bottom face and the side face of the trench 8a on which the second impurity diffusion layer 14a is formed, except the region where the first and second impurity diffusion layers 13a, 14a are formed. In other words, the first active region 6b and the second active region 6a have side portions facing each other across the channel region located therebetween, and the channel S1 is formed on the side portion of the second active region 6a and on the top of the channel layer.

Figure 23A:
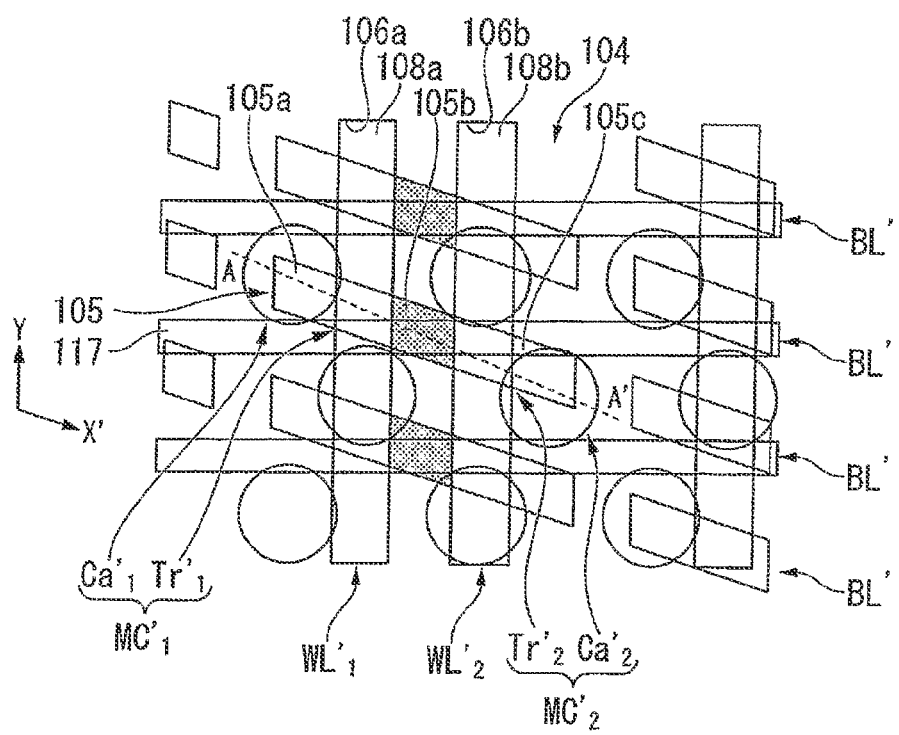
FIG. 23A is a plan view showing, partially permanently, a part of a related semiconductor device.
Figure 23B:
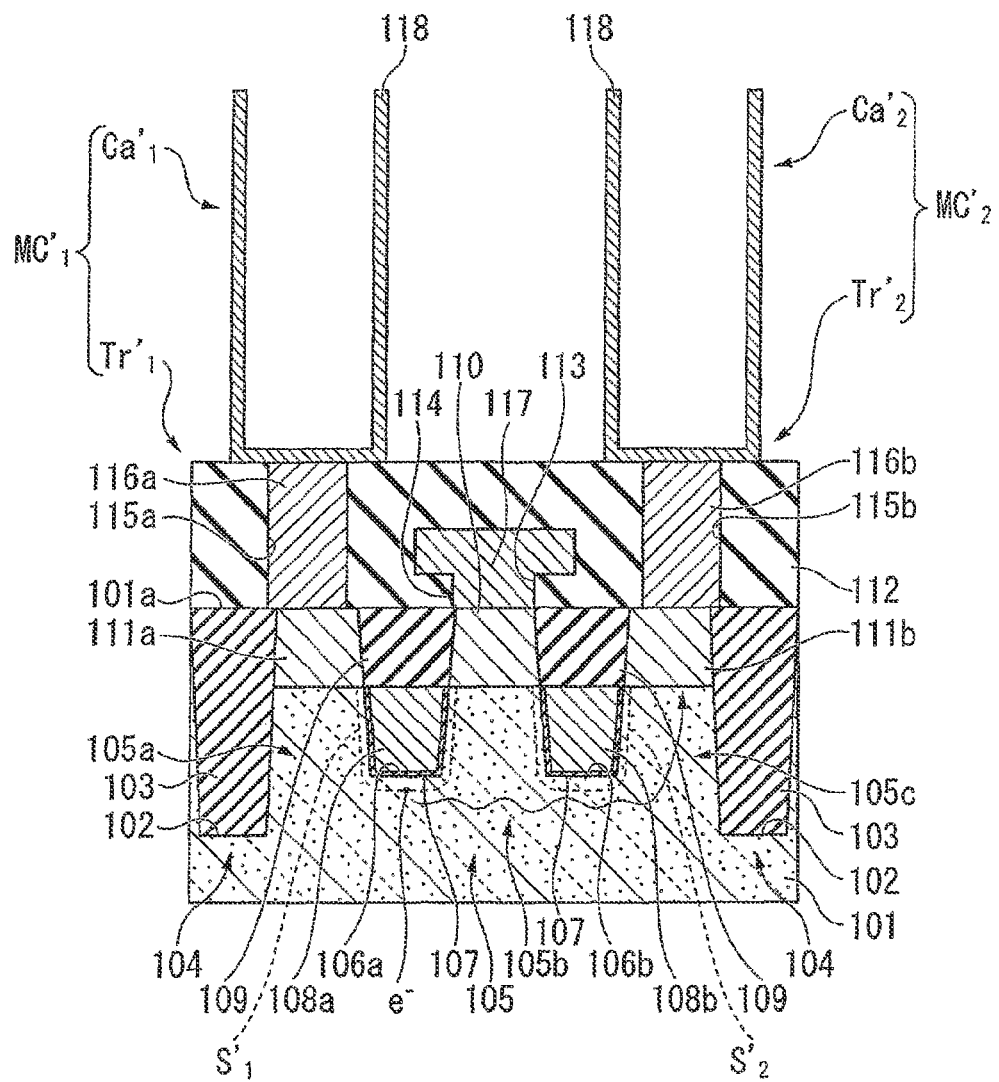
FIG. 23B is a cross-sectional view showing the semiconductor device, taken along the line A-A' of FIG. 23A.

This makes it possible to reduce the channel resistance in comparison, for example, with the related semiconductor device shown in FIG. 23B in which the channel S1' is formed on the three faces, namely the opposite side faces and the bottom face of the buried gate trench 106a. Therefore, sufficient ON current of the transistor Tr1 can be ensured.

Likewise, the other transistor Tr2 is configured to have a gate electrode 7b, a first impurity diffusion layer (drain region) 13b, and a second impurity diffusion layer (source region) 14b. The gate electrode 7b is buried in one of the two buried gate trenches 8a, 8b dividing the semiconductor region 6, that is, the buried gate trench 8b, with the gate insulating film 9 interposed therebetween. The first impurity diffusion layer (drain region) 13b is formed by diffusing an impurity into the other side face of the bit contact trench 11 dividing the first active region 6b located at the center of the three active regions 6a, 6b, 6c divided by the two buried gate trenches 8a, 8b, to a depth equivalent to the level of the bottom face of the other buried gate trench 8b. The second impurity diffusion layer (source region) 14b is formed by diffusing an impurity into the other of the two second active regions 6a, 6c located on the opposite sides of the first active region 6b (active region 6c), to a depth equivalent to the level of the top of the other gate electrode 7b.

In the other transistor Tr2, a channel S2 is formed on the two faces of the trench 8b, namely the bottom face and the side face on which the second impurity region 14b is formed, except the region where the first and second impurity diffusion layers 13b, 14b are formed. In other words, the first active region 6b and the other second active region 6c respectively have side portions facing to each other across the channel layer located therebetween, and the channel S2 is formed on the side portion of the second active region 6c and the top of the channel layer.

This makes it possible to reduce the channel resistance in comparison, for example, with the related semiconductor device shown in FIG. 23B in which the channel S2' is formed on the three faces, namely the opposite side faces and the bottom face of the buried gate trench 106b. Therefore, sufficient ON current of the one transistor Tr2 can be ensured.

In the semiconductor device 1A according to the invention, neither the channel S1 nor the channel S2 is formed on the side faces of the buried gate trenches 8a, 8b on which the first impurity diffusion layers 13a, 13b are formed. The insulating film 12 is buried in the bit contact trench 11 that is formed deeper than the buried gate trenches 8a, 8b, so that insulating film 12 has such a thickness that the top face thereof is located at a higher level than the bottom faces of the buried gate trenches 8a, 8b. Therefore, the semiconductor device 1A can be prevented from occurrence of interference of operation between the two selection transistors Tr1, Tr2 provided side by side in one semiconductor region 6.

This means that it is possible to prevent electrons induced in the channel region (channel S1 or S2) in one of the adjacent transistors Tr1 (Tr2) from moving to the channel region (channel S2 or S1) of the other transistor Tr2 (Tr1). Therefore, the semiconductor device 1A is able to prevent the interference between the adjacent two transistors Tr1, Tr2 when they are operated, and to improve the reliability remarkably.

The semiconductor device 1A according to the invention has bit wiring layers (bit lines) BL connected in common to the first impurity diffusion layers 13a, 13b formed on the opposite side faces of the bit contact trench 11 via the bit contact plug 17, and capacitors Ca1, Ca2 connected to the second impurity diffusion layers 14a, 14b via the capacity contact plugs 20a, 20b, whereby DRAM memory cells MC1, MC2 are formed of the two transistors Tr1, Tr2 arranged in one semiconductor region 6 and the capacitors Ca1, Ca2 connected the respective transistors Tr1, Tr2.

This configuration is able to prevent occurrence of disturb error caused by the state of memory in one of the adjacent memory cells MC1 (MC2) being changed according to an operating state of the other memory cell MC2 (MC1).

For example, data of "0" is stored in one of the two memory cells MC1, MC2 arranged in one semiconductor region 6, that is, in the memory cell MC1, while data of "1" is stored in the other memory cell MC2. According to the invention, even if ON/OFF operation is repeatedly performed on the transistor Tr1 of the memory cell MC1, occurrence of a disturb error, such as the data stored in the memory cell MC2 being destroyed, can be avoided.

In the first place, data of "0" is stored in the memory cell MC1. Specifically, one of the transistors (transistor Tr1) is turned ON while a low-level potential is applied to the bit line BL. Thus, the low-level potential is applied to the lower electrode 21 of one of the capacitors (Ca1). After that, the transistor Tr1 is turned OFF, whereby data of "0" (low-level) is accumulated in the capacitor Ca1.

Next, data of "1" is stored in the other memory cell MC2. Specifically, the other transistor Tr2 is turned ON while a high-level potential is applied to the bit line BL. Thus, the high-level potential is applied to the lower electrode 21 of the other capacitor Ca2. After that, the other transistor Tr2 is turned OFF, whereby data of "1" (high-level data) is accumulated in the other capacitor Ca2.

It is assumed that in this state the same operation is repeated on the memory cell MC1 arranged in another semiconductor region 6 using the same word line WL1 with the memory cell MC1. In this manner, the ON/OFF operation is repeated on one of the transistors (Tr1) whereby a high-level potential is repeatedly applied to the word line WL1.

As described above, it is possible to prevent electrons induced in the channel region (S1) of the one transistor Tr1 from moving to the channel region (S2) of the other transistor Tr2. Therefore, it is possible to prevent the occurrence of a disturb error in which data of "1" (high level data) accumulated in the capacitor Ca2 is rewritten to data of "0" (low level data).

The semiconductor device 1A according to the invention, as described above, is able to normally operate the DRAM even if the distance between the two memory cells MC1, MC2 arranged in one semiconductor region 6 is reduced due to the size reduction of the memory cells, and hence the reliability thereof can be improved significantly.

(Manufacturing Method of Semiconductor Device)

Next, a manufacturing method of the semiconductor device 1A will be described with reference to FIGS. 3A to 13D.

In FIGS. 3A to 13D, those drawings with suffix A are plan views sequentially showing respective steps of a manufacturing method of the semiconductor device 1A. The drawings with suffix B are cross-sectional views taken along the line A-A' of the respective same numbered drawings with suffix A. The drawings with suffix C are cross-sectional views taken along the line B-B' of the respective same numbered drawings with suffix A. The drawings with suffix D are cross-sectional views taken along the line C-C' of the respective same numbered drawings with suffix A.

In order to manufacture the semiconductor device 1A, as shown in FIGS. 3A to 3D, an unprocessed semiconductor substrate 2 is prepared, and a plurality of element isolation trenches 3a extending in a first direction X' are formed in a surface layer of the semiconductor substrate 2 such that they are spaced from each other in a second direction Y intersecting with the first direction X', and then an element isolation insulating film 4 is formed so as to be buried in these trenches 3a. As a result, a plurality of element isolation regions 5 and a plurality of semiconductor regions 6 isolated by these element isolation regions 5 are arranged alternately in stripes. The semiconductor substrate 2 may be, for example, a silicon substrate containing a predetermined concentration of boron (B) or other P-type impurity. The element isolation insulating film 4 may be, for example, a silicon oxide film.

Next, as shown in FIGS. 4A to 4D, a plurality of element isolation trenches 3b extending in the second direction Y are formed in the surface layer of the semiconductor substrate 2 such that they are spaced apart from each other in a direction orthogonal to the second direction Y, and then an element isolation insulating film 4 is formed to be buried in these trenches 3b. As a result, a plurality of semiconductor regions 6 are each formed into an island shape defined by the element isolation insulating film 4 (element isolation regions 5) buried in the element isolation trenches 3a, 3b. Specifically, these semiconductor regions 6 have a substantially rectangular shape (parallelogram) as viewed in plan, and extend in the first direction X', while spaced from each other in first direction X' and in the second direction Y intersecting with the first direction X'.

As shown in FIGS. 5A to 5D, a mask layer 30 is formed on the surfaces of the semiconductor substrate 2 and the element isolation insulating film 4, the mask layer 30 having openings 30a at the positions corresponding to the buried gate trenches 8a, 8b. Specifically, a silicon nitride film serving as the mask layer 30 is applied on the surfaces of the semiconductor substrate 2 and the element isolation insulating film 4, and then a resist is applied thereon. This resist is patterned by a lithography technique to form a resist pattern (not shown) having openings at the positions corresponding to the buried gate trenches 8a, 8b. The silicon nitride film is then patterned by anisotropic dry etching using this resist pattern. While this resist pattern is removed from the top of the silicon nitride film as the etching process progresses, the shape of this resist pattern is directly transferred to the silicon nitride film. In this manner, the mask layer 30 having openings 30a at the positions corresponding to the buried gate trenches 8a, 8b can be formed on the surfaces of the semiconductor substrate 2 and the element isolation insulating film 4.

Next, as shown in FIGS. 6A to 6D, the surface layer of the semiconductor substrate 2 is patterned by anisotropic dry etching using this mask layer 30, whereby a plurality of buried gate trenches 8a, 8b are formed in the surface layer of the semiconductor substrate 2.

When forming the buried gate trenches 8a, 8b, the trench 8B formed in the element isolation region 5 is formed to a greater depth than the trench 8A formed in the semiconductor region 6. As a result, fins 6A (see FIG. 6C) can be formed by the semiconductor region 6 partially protruding from the bottom face of the buried gate trenches 8a, 8b.

Each of the fins 6A has a top face and first and second side faces continuing from the top face. The first and second side faces spread downward relative to the second direction from first and second edges located at the opposite sides of the top face.

When forming the buried gate trenches 8a, 8b, the element isolation region 5 (element isolation insulating film 4) exposed from the openings 30a of the mask layer 30 is etched, and then the semiconductor region 6 (semiconductor substrate 2) is etched. This makes it possible to prevent unetched portions from being left on the side faces of the fins 6A.

As shown in FIGS. 6A to 6D, a gate insulating film 9 is formed on the entire surface of the semiconductor substrate 2 having the mask layer 30, so as to cover the surfaces of the semiconductor regions 6 exposed in the buried gate trenches 8a, 8b. The gate insulating film 9 may be, for example, a high-temperature oxide film formed by a CVD method or a high dielectric film. Alternatively, a silicon oxide film may be formed to cover the surfaces of the semiconductor regions 6 exposed in the buried gate trenches 8a, 8b by thermally oxidizing the surfaces of the semiconductor regions 6 exposed in the trenches 8a, 8b.

Next, a conductive film is formed on the entire surface of the semiconductor substrate 2 having the mask layer 30 formed thereon, so as to fill the buried gate trenches 8a, 8b. The conductive film is then polished by chemical mechanical polishing (CMP) to flatten the surface thereof until the surface of the mask layer 30 serving as a stopper is exposed. After that, the conductive film is etched back till a predetermined thickness. As a result, as shown in FIGS. 6A to 6D, gate electrodes 7a, 7b (word wiring layers WL1, WL2) are formed buried in the respective buried gate trenches 8a, 8b. The gate electrodes 7a, 7b cover the top faces and the first and second side faces of the fins 6A via the gate insulating films 9.

The conductive film may be one formed by stacking a polysilicon film and a metal film sequentially. The polysilicon film can be formed by introducing an impurity such as phosphorus (P) or the like during film formation by a CVD method. Alternatively, an N-type or P-type impurity may be introduced by an ion implantation method in a later step into a polysilicon film which has been formed without being doped with an impurity. The metal film can be formed using a high-melting-point metal such as tungsten (W), tungsten nitride (WN), or tungsten silicide (WSi).

Next, as shown in FIGS. 7A to 7D, a silicon nitride film 31 serving as the cap insulating film 10 is formed on the entire surface of the semiconductor substrate 2. The silicon nitride film 31, the gate oxide film 9 and the mask layer 30 are polished by CMP, to flatten the surface until the surface 2a of the semiconductor substrate 2 is exposed. As a result, as shown in FIGS. 8A to 8D, the cap insulating film 10 can be formed buried in the buried gate trenches 8a, 8b.

Next, as shown in FIGS. 9A to 9D, a mask layer 32 (first interlayer insulating film 15) is formed on the entire surface including the top face of the semiconductor substrate 2. The mask layer 32 has openings 32a (bit contact holes 16) at the positions corresponding to the bit contact trenches 11. Specifically, a silicon oxide film serving as the mask layer 32 is formed on the surface of the semiconductor substrate 2, and a resist is applied thereon. This resist is patterned by a lithography technique to form a resist pattern (not shown) having openings at the positions corresponding to the bit contact trenches 11. The silicon oxide film is patterned by anisotropic dry etching using this resist pattern. While this resist pattern is removed from the top of the silicon oxide film with the progress of the etching process, the shape of this resist pattern is directly transferred to the silicon oxide film. As a result, a mask layer 32 having openings 32a at the positions corresponding to the bit contact trenches 11 can be formed on the entire surface including the top face of the semiconductor substrate 2.

Next, as shown in FIGS. 10A to 10D, the surface layer of the semiconductor substrate 2 is patterned by anisotropic dry etching using this mask layer 32 (15), while a plurality of bit contact trenches 11 are formed in the surface layer of the semiconductor substrate 2.

Next, as shown in FIGS. 10A to 10D, a liner insulating film 33a is formed to cover the surfaces of the bit contact trenches 11, and then a buried insulating film 33b is formed in the inside of each of the bit contact trenches 11. The liner insulating film 33a may be, for example, a silicon oxide film formed by a CVD method. The buried insulating film 33b may be, for example, a boron phosphorus silicon glass (BPSG) film, a spin-on dielectrics (SOD) film, or a fluorine-doped silicon oxide (SiOF) film. The liner insulating film 33a and the buried insulating film 33b are etched back by anisotropic dry etching, whereby an insulating film 12 having a predetermined thickness can be formed in each of the bit contact trenches 11. The face of the buried insulating film 12 is located at a higher level than the top face of the channel regions, while the bottom face is located at a lower level than the top face of the channel regions.

Next, as shown in FIGS. 11A to 11D, impurity ions are introduced in oblique directions to the opposite side faces (first sides) of each of the bit contact trenches 11, whereby a first impurity diffusion layer 13 (13a, 13b) is formed. The impurity may be phosphorus or other N-type impurity, and can be introduced by ion implantation at a predetermined concentration. The ion implantation is performed to the opposite side faces of the bit contact trench 11, oblique to the first direction X' and second direction Y. As a result, a first impurity diffusion layer 13 is formed, having the impurity diffused from the top face of the active region 6b (the surface 2a of the semiconductor substrate 2) to a depth equivalent to the level of the bottom faces of the buried gate trenches 8a, 8b. Specifically, the first impurity diffusion layer 13 is formed to be deeper than the top face of the buried insulating film 12 and to surround the buried insulating film 12. The width of the first impurity diffusion layer 13 is gradually enlarged downward' from the top face 2a of the semiconductor substrate 2, with respect to the first direction X'.

Subsequently, a metal film is formed on the entire surface of the semiconductor substrate 2 having the mask layer 32 (15) formed thereon, so as to fill the bit contact trenches 11. The metal film is polished by CMP and flattened until the surface of the mask layer 32 (15) serving as a stopper is exposed. After that, etch-back is performed until the top face of the metal film becomes flush with the surface 2a of the semiconductor substrate 2. As a result of this, as shown in FIGS. 12A to 12D, bit contact plugs 17 are formed, buried in the respective bit contact trenches 11. The bit contact plugs 17 are surrounded by the first impurity diffusion layers 13a, 13b, and the side faces are in contact with the first impurity diffusion layers. The metal film may be made of CoSi2, NiSi2, TiSi2, TiN, WN, W or the like.

As shown in FIGS. 12A to 12D, second impurity diffusion layers 14a, 14b are formed by implanting ions of phosphorus or other N-type impurity at a predetermined concentration into the active regions 6a, 6c located on the opposite sides of each of the semiconductor regions 6. The second impurity diffusion layers 14a, 14b are formed by diffusing an impurity into the active regions 6a, 6c from the top faces of the active regions 6a, 6c (the surface 2a of the semiconductor substrate 2), to a depth equivalent to the level of the top faces of the gate electrodes 7a, 7b. The second impurity diffusion layers 14a, 14b may be slightly deeper than the top faces of the gate electrodes 7a, 7b.

Next, as shown in FIGS. 13A to 13D, bit wiring layers BL are formed directly above the bit contact plugs 17 to be electrically connected to the bit contact plugs 17. Specifically, an impurity-doped polysilicon film is formed on the entire surface including the mask layer 32 (first interlayer insulating film 15) so as to fill the openings 32a (bit contact holes 16), and then a tungsten silicide film is formed thereon. The impurity can be introduced into the impurity-doped polysilicon film during film formation using the CVD method. Alternatively, it is also possible to form a non-doped silicon film and then to introduce an impurity into the film by ion implantation. A resist pattern is formed on a laminated film consisting of the impurity-doped polysilicon film and the tungsten silicide film so as to cover regions where the bit wiring layers BL are to be formed. The bit wiring layers BL are formed by patterning the laminated film by dry etching using this resist pattern.

The bit wiring layers BL also can be formed by a method in which after forming a tungsten silicide film and a cover silicon nitride film, the cover silicon nitride film is once patterned using the resist pattern, and then the underlying tungsten silicide film and the impurity-doped polysilicon film are etched using a cover silicon film as a mask.

As seen from FIG. 2, after forming a second interlayer insulating film 18, capacity contact holes 19a, 19b are formed directly over the second impurity diffusion layers 14a, 14b to pass through the first and second interlayer insulating films 15, 18. Then, capacity contact plugs 20a, 20b are formed, buried in these capacity contact holes 19a, 19b and electrically connected to the second impurity diffusion layers 14a, 14b. Further, there are stacked, directly above each of the capacity contact plugs 20a, 20b, a lower electrode 21, a third interlayer insulating film 24, a capacity insulating film 22 covering the lower electrode 21, and an upper electrode 23 covering the capacity insulating film 22. The lower electrode 21, the capacity insulating film 22, and the upper electrode 23 form a capacitor Ca serving as a memory element of a DRAM memory cell.

Then, a fourth interlayer insulating film 25 is formed on the upper electrode 23, covering the entire surface thereof. An upper wiring layer 26 is formed on the fourth interlayer insulating film 25, and a surface protection film 27 is formed on the fourth interlayer insulating film 25 so as to cover the upper wiring layer 26.

The semiconductor device 1A as shown in FIG. 1 and FIG. 2 can be manufactured by the steps as described above.

According to the invention as described above, ON current of the aforementioned transistors Tr1, Tr2 can be ensured sufficiently, and even if the distance between the two memory cells MC1, MC2 arranged in one semiconductor region 6 is reduced due to size reduction of the memory cells, occurrence of disturb error can be prevented, and normal operation of the DRAM can be ensured. Thus, the semiconductor device 1A having high reliability can be manufactured appropriately.

(Modification 1-1)

The invention is not necessarily limited to the first embodiment, but may be modified in various manners without departing from the scope of the invention.

Figure 14:
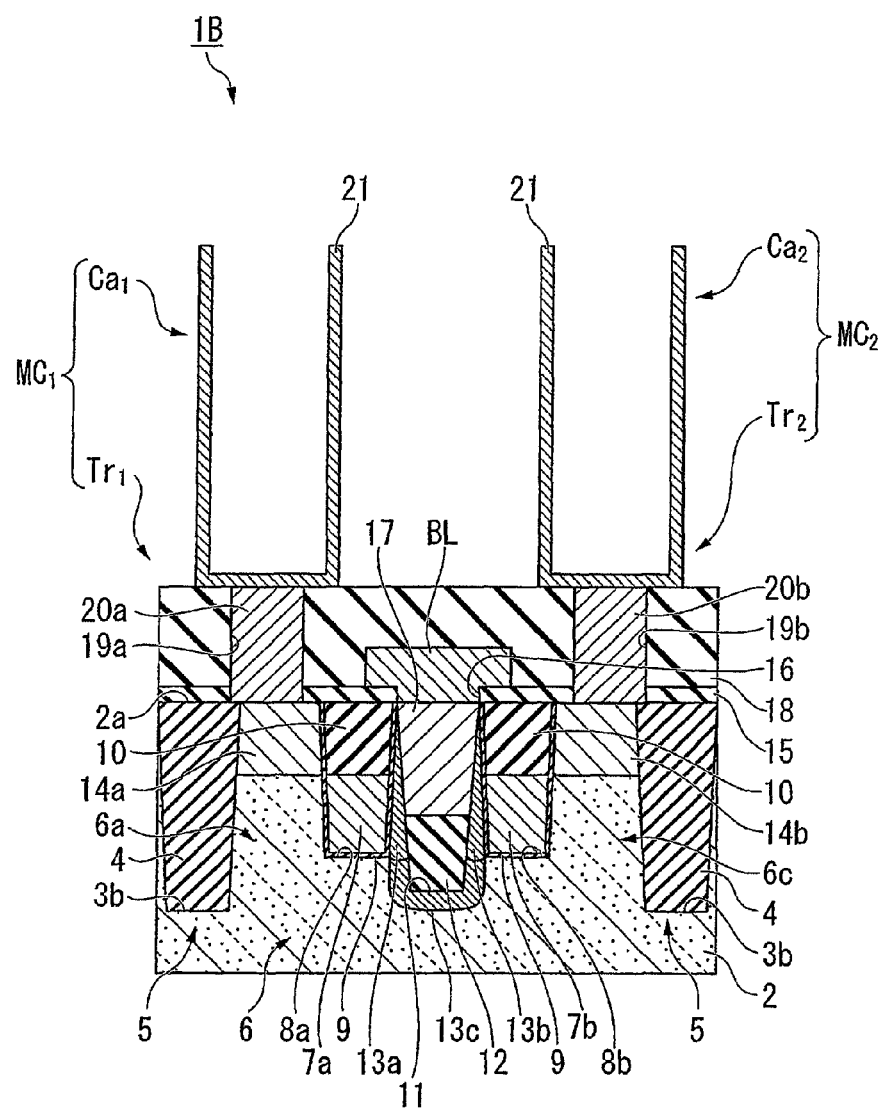
FIG. 14 is a cross-sectional view showing a modification of the semiconductor device according to the first embodiment.

For example, like the semiconductor device 1B shown in FIG. 14, a configuration may be employed in which first impurity diffusion layers 13*a*, 13*b*, 13*c* are formed to cover the regions from the opposite side faces to the bottom face of the bit contact trench 11. This means that, the semiconductor device 1B has a configuration in which the first impurity diffusion layers 13*a*, 13*b* formed on the opposite side faces of the bit contact trench 11 are joined to the first impurity diffusion layer 13*c* formed on the bottom face of the trench 11. In this configuration, the buried insulating film 12 is surrounded by the first impurity diffusion layer 13 not only at its side faces but also at its bottom face.

When forming these first impurity diffusion layers 13*a*, 13*b*, 13*c*, a BPSG film may be used as the insulating film 12, so that an impurity contained in this BPSG film is diffused into the opposite side faces and the bottom face of the bit contact trench 11. It is also possible to employ a method in which oblique ion implantation is performed to the opposite side faces and the bottom face of the bit contact trench 11 after formation of the bit contact trench 11, and then an insulating film 12 is formed to be buried in the bit contact trench 11. These methods may be employed in combination.

The semiconductor device 1B also may assume a configuration other than the one described above, like the semiconductor device 1A. Therefore, description of such other configuration will be omitted and like components are assigned with like reference numerals in the drawings.

In the semiconductor device 1B having the configuration described above, no channel S1, S2 is formed on the side faces of the buried gate trenches 8*a*, 8*b* on which first impurity diffusion layers 13*a*, 13*b* are formed. Further, a first impurity diffusion layer 13*c* is formed on the bottom face of the bit contact trench 11 which is formed deeper than the buried gate trenches 8*a*, 8*b*. An insulating film 12 is buried in this trench 11 in such a thickness that the top face thereof is located above the bottom faces of the buried gate trenches 8*a*, 8*b*. Like in the semiconductor device 1A, this configuration is able to prevent occurrence of interference in operation between the two transistors Tr1, Tr2 arranged side by side in one semiconductor region 6.

Further, in the semiconductor device 1B, like the semiconductor device 1A, the DRAM can be operated normally even if the distance between two memory cells MC1, MC2 arranged in one semiconductor region 6 is reduced due to size reduction of the memory cells, and thus the reliability can be improved remarkably.

Second Embodiment

Semiconductor Device

Figure 15:
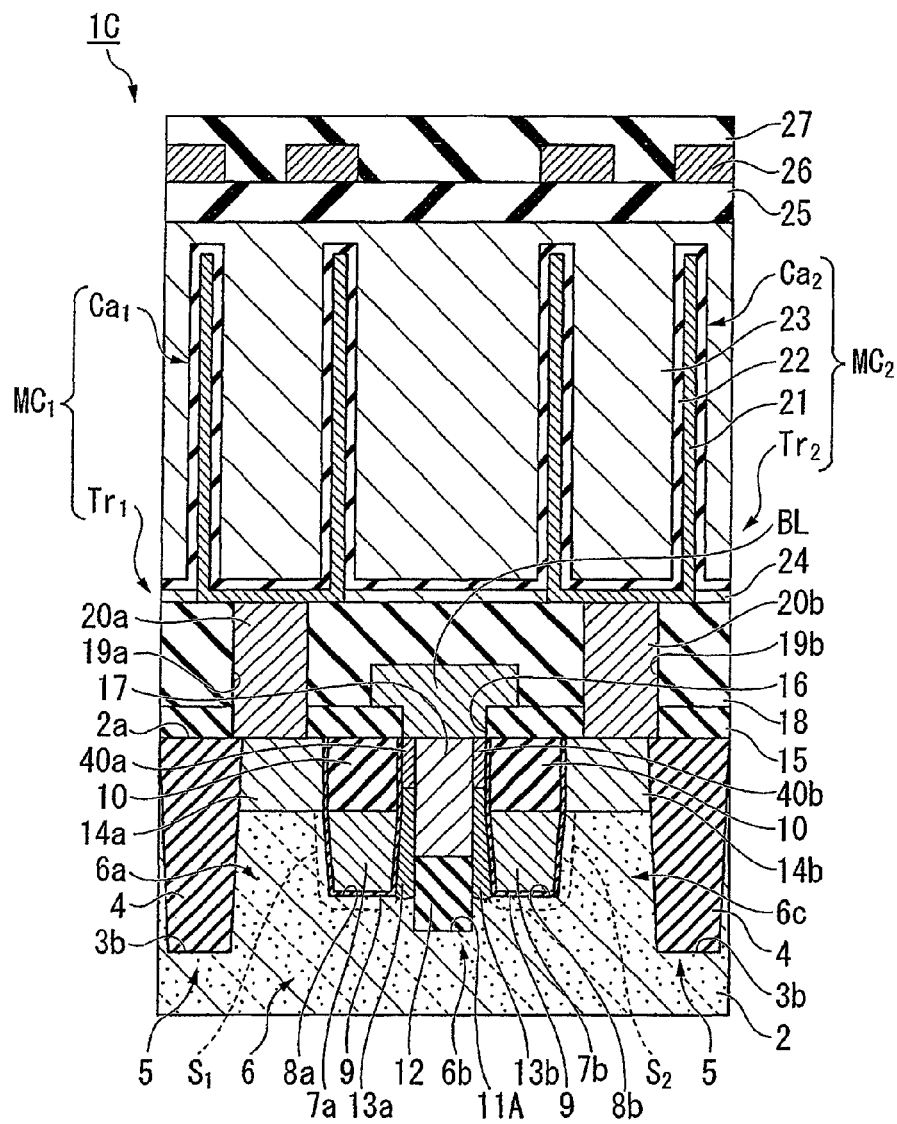
FIG. 15 is a cross-sectional view showing a part of a semiconductor device according to a second embodiment of the invention.

A second embodiment of the invention will be described in terms of a configuration of a semiconductor device 1C shown in FIG. 15. The planar layout of this semiconductor device 1C is the same as the semiconductor device 1A shown in FIG. 1, and FIG. 15 is a cross-sectional view of the semiconductor device 1C taken along the line A-A' of FIG. 1. In the description below, like or equivalent part or components to those of the semiconductor device 1A will be assigned with the same reference numerals.

The semiconductor device 1C functions as a DRAM in the end. The DRAM has, on a semiconductor substrate, a cell array region in which a plurality of memory cells MC1, MC2 are arranged in matrix, and a peripheral circuit region which located on the periphery of the cell array region and in which a circuit or the like for controlling operation of the memory cells MC1, MC2 is formed.

The memory cells MC1, MC2 arranged in the cell array region are substantially formed of selection transistors Tr1, Tr2, and capacitors Ca1, Ca2 which are electrically connected to either source or drain of the selection transistors Tr1, Tr2.

Specifically, there are provided, in the cell array region of the semiconductor device 1C, an element isolation region 5 which is formed by forming element isolation trenches 3*a*, 3*b* in the surface layer of the semiconductor substrate 2, and burying an element isolation insulating film 4 in these trenches 3*a*, 3*b*, and a plurality of semiconductor regions 6 insulated and separated by the element isolation region 5.

The element isolation region 5 is a so-called STI (Shallow Trench Isolation) region. The element isolation region 5 is formed by burying the element isolation insulating film 4 in a trench 3*a* extending in a first direction X' and a trench 3*b* extending in a second direction Y intersecting with the first direction X', and isolates the adjacent semiconductor regions 6 from each other.

The semiconductor region 6 is formed of a part of the semiconductor substrate 2, and is defined into an island shape by the element isolation insulating film 4 (element isolation region 5) buried in the element isolation trenches 3*a*, 3*b*. Specifically, the semiconductor region 6 has a rectangular shape as viewed in plan, and extends in the first direction X'. The semiconductor regions 6 are arranged while being spaced from each other in the second direction Y intersecting with the first direction X' and first direction X.

The semiconductor device 1C, likewise the semiconductor device 1A, employs such a layout that the cell size is 6F2 (F denotes a minimum feature size), and has a configuration in which two (two-bit) memory cells MC1, MC2 are arranged in one semiconductor region 6. Therefore, two selection transistors Tr1, Tr2 are arranged in each of the semiconductor regions 6.

More specifically, a plurality of stripe-shaped word wiring layers (word lines) WL1, WL2 are arranged in the cell array region of this semiconductor device 1C to extend in the second direction Y, while being spaced from each other in a direction orthogonal to the second direction Y. These word wiring layers WL1, WL2 respectively function as gate electrodes 7*a*, 7*b* of the selection transistors Tr1, Tr2, and are provided such that two word wiring layers are arranged side by side to cross each the of the semiconductor region 6.

In the selection transistors Tr1, Tr2, the gate electrodes 7*a*, 7*b* are located at a lower level than the surface 2*a* of the semiconductor substrate 2, whereby the selection transistors Tr1, Tr2 have a so-called buried gate type channel structure.

There are formed, in the surface layer of the semiconductor substrate 2, a plurality of buried gate trenches 8*a*, 8*b* so as to extend in a (second) direction Y intersecting with the semiconductor regions 6. These buried gate trenches 8*a*, 8*b* are arranged side by side in pairs so as to divide the semiconductor regions 6.

The semiconductor region 6 is divided into three active regions 6a, 6b, 6c by two buried gate trenches 8a, 8b. Regions located between a first active region 6b located at the center of the three active regions, and second active regions 6a, 6c located on the opposite sides, that is, regions located below the buried gate trenches 8a, 8b are sometimes called channel regions. The first active region 6b and each of the second active regions 6a, 6c respectively have a first side and a second side facing each other across the top faces of the channel regions.

The semiconductor device has a gate insulating film 9 covering the surfaces of the semiconductor regions 6 exposed in the buried gate trenches 8a, 8b, word line wiring layers (word lines) WL1, WL2 buried in the buried gate trenches 8a, 8b, and a cap insulating film 10 also buried in the buried gate trenches 8a, 8b on top of the word line wiring layers (word lines) WL1, WL2. The word line wiring layers WL1, WL2 are formed such that they are buried in the buried gate trenches 8a, 8b, respectively, and cross over the semiconductor region 6 via the gate insulating film 9. As a result, the two word line wiring layers WL1, WL2 crossing the single semiconductor region 6 function as gate electrodes 7a, 7b of the selection transistors Tr1, Tr2. In other words, the gate electrodes 7a, 7b extend from the semiconductor region 6 to the element isolation region 5 along the second direction, and cover the first side of the first active layer 6b and the second sides of the second active layers 6a, 6c via the gate insulating film 9. The top faces of the gate electrodes 7a, 7b are located at a lower level than the top faces of the semiconductor region 6 and element isolation region 5. Further, the top faces of the gate electrodes 7a, 7b are protected by the cap insulating film 10 provided in a state buried in the buried gate trenches 8a, 8b.

There is formed, in the surface layer of the semiconductor substrate 2, a bit contact trench 11A extending in the direction (second direction) Y parallel to the buried gate trenches 8a, 8b. The bit contact trench 11A is formed deeper than the buried gate trenches 8a, 8b so as to divide the first active region 6b.

An insulating film 12 is buried in the bit contact trench 11A and has such a thickness that the top face thereof is located at a higher level than the bottom faces of the buried gate trenches 8a, 8b. This insulating film 12 isolates the selection transistors Tr1, Tr2 which are adjacent to each other across the bit contact trench 11.

The buried gate trenches 8a, 8b are formed such that their widths are identical up to midway in its depth direction from the surface 2a of the semiconductor substrate 2 and, from midway, the widths are gradually reduced toward the bottom face. Thus, as the size reduction of the selection transistor Tr1, Tr2 progresses, the upper side faces of at least upper part of the buried gate trenches 8a, 8b must be formed vertically. On the other hand, the bit contact trench 11A is formed in a constant width from the surface 2a of the semiconductor substrate to the bottom face thereof.

A pair of sidewall insulating films 40a, 40b are provided on the opposite side faces of the bit contact trench 11A to cover from the surface 2a of the semiconductor substrate 2 up to the midway position of the bit contact trench 11A in the depth direction. These sidewall insulating films 40a, 40b are provided for the purpose of controlling the width of the bit contact trench 11A to be a constant value. This means that the bit contact trench 11A is formed in a constant width in a depth direction according to the distance between the pair of sidewall insulating films 40a, 40b.

First impurity diffusion layers 13a, 13b functioning as drain regions of the selection transistors Tr1, Tr2 are provided on the opposite side faces of the bit contact trench 11A in which the insulating film 12 is buried. The first impurity diffusion layers 13a, 13b are located under the sidewall insulating films 40a, 40b, and are formed to a depth equivalent to the level of the bottom faces of the buried gate trenches 8a, 8b, by diffusing an impurity into the opposite side faces of the bit contact trench 11A. The sidewall insulating films 40a, 40b and the first impurity diffusion layers 13a, 13b are formed between the buried gate trenches 8a, 8b and the bit contact trench 11A.

There are provided, in the second active regions 6a, 6c located on the opposite sides of the first active region 6b, second impurity diffusion layers 14a, 14b functioning as source regions of the selection transistors Tr1, Tr2. These second impurity diffusion layers 14a, 14b are formed by diffusing an impurity into the respective active regions 6a, 6c from the top faces of the second active regions 6a, 6c (the surface 2a of the semiconductor substrate 2) to a depth equivalent to the level of the top faces of the gate electrodes 7a, 7b.

A first interlayer insulating film 15 is provided on the semiconductor substrate 2 to cover the entire surface thereof. The first impurity diffusion layer 14a is electrically connected to the bit contact plug 17 buried in the bit contact trench 11 and in a bit contact hole 16 formed in the first interlayer insulating film 15.

The bit contact plug 17 is electrically connected to a bit wiring layer (bit line) BL formed directly above the bit contact plug 17. This bit wiring layer BL is located at a higher level than the surface 2a of the semiconductor substrate 2. The bit wiring layer BL is formed in plurality in a striped shape extending in a direction X orthogonal to the word wiring layers WL1, WL2. The bit wiring layers BL are arranged while being spaced from each other in a direction (second direction) Y in which the word wiring layers WL1, WL2 extend. These bit wiring layers BL are electrically connected to the bit contact plug 17 by sequentially passing through the central parts (the first active region 6b) of the respective semiconductor regions 6. Thus, the two transistors Tr1, Tr2 arranged in one semiconductor region 6 share one bit wiring layer BL.

A second interlayer insulating film 18 is provided on the first interlayer insulating film 15 to cover the entire surface thereof. The second impurity diffusion layers 14a, 14b are electrically connected to capacity contact plugs 20a, 20b buried in capacity contact holes 19a, 19b passing through the first and second interlayer insulating films 15, 18.

Further, the capacity contact plugs 20a, 20b are electrically connected to capacitors Ca1, Ca2 formed directly above the capacity contact plugs 20a, 20b. The capacitors Ca1, Ca2 are each composed of a lower electrode 21, a capacity insulating film 22, and an upper electrode 23 which are stacked in this order.

The lower electrodes 21 are positioned directly above the respective capacity contact plugs 20a, 20b and have a bottomed cylindrical crown shape. The lower electrodes 21 are isolated from each other by a third interlayer insulating film 24 interposed therebetween. The capacity insulating film 22 is formed to cover the surfaces of the lower electrode 21 and third interlayer insulating film 24. The upper electrode 23 is formed on the entire surface to cover the capacity insulating film 22 and to fill the inner spaces of the lower electrodes 21.

The capacitors Ca1, Ca2 need not necessarily be of a crown type using the inner surfaces and outer peripheral surfaces of the lower electrodes 21 as electrodes. The structure of the capacitors Ca1, Ca2 is not restricted particularly, and may be a cylinder type using the inner surfaces of the lower electrodes 21 but not using the outer peripheral surfaces as electrodes.

There are provided, on the upper electrode 23, a fourth interlayer insulating film 25 to cover the entire surface thereof, an upper wiring layer 26 formed on the fourth interlayer insulating film 25, and a surface protection film 27 covering the upper wiring layer 26.

In this manner, a DRAM having a plurality of memory cells MC1, MC2 in the cell array region is formed.

The semiconductor device 1C having the configuration as described above operates as a DRAM which is capable of perform operation to store information by determining whether or not electrical charge is accumulated in the capacitors Ca1, Ca2 while repeating ON/OFF operations on the selection transistors Tr1, Tr2.

The semiconductor device 1C is configured to be able to ensure sufficient ON current for the two selection transistors Tr1, Tr2 arranged in the one semiconductor region 6, and yet to prevent occurrence of interference of operation between the two selection transistors Tr1, Tr2.

Specifically, the transistor Tr1 is configured to have a gate electrode 7a, a first impurity diffusion layer (drain region) 13a, and a second impurity diffusion layer (source region) 14a. The gate electrode 7a is buried in one of the two buried gate trenches 8a, 8b dividing the semiconductor region 6, that is, in the buried gate trench 8a with the gate insulating film 9 interposed therebetween. The first impurity diffusion layer (drain region) 13a is formed by diffusing an impurity into the one of the side faces of the bit contact trench 11A dividing the first active region 6b located at the center of the three active regions 6a, 6b, 6c divided by the buried gate trenches 8a, 8b, to a depth equivalent to the level of the bottom face of the buried gate trench 8a. The second impurity diffusion layer (source region) 14a is formed by diffusing an impurity into one of the two second active regions 6a, 6c on the opposite sides of first active region 6b (active region 6a) into a depth equivalent to the level of the top face of the gate electrode 7a.

In the transistor Tr1, a channel S1 is formed over the bottom face and the side face of the trench 8a on which the second impurity diffusion layer 14a is formed, except the region where the first and second impurity diffusion layers 13a, 14a are formed. In other words, the first active region 6b and the second active region 6a have side portions facing each other across the channel region located therebetween, and the channel S1 is formed on the side portion of the second active region 6a and on the top of the channel layer.

This makes it possible to reduce the channel resistance in comparison, for example, with the related semiconductor device shown in FIG. 23B in which the channel S1' is formed on the three faces, namely the opposite side faces and the bottom face of the buried gate trench 106a. Therefore, sufficient ON current of the transistor Tr1 can be ensured.

Likewise, the other transistor Tr2 is configured to have a gate electrode 7b, a first impurity diffusion layer (drain region) 13b, and a second impurity diffusion layer (source region) 14b. The gate electrode 7b is buried in one of the two buried gate trenches 8a, 8b dividing the semiconductor region 6, that is, the buried gate trench 8b, with the gate insulating film 9 interposed therebetween. The first impurity diffusion layer (drain region) 13b is formed by diffusing an impurity into the other side face of the bit contact trench 11A dividing the first active region 6b located at the center of the three active regions 6a, 6b, 6c divided by the two buried gate trenches 8a, 8b, to a depth equivalent to the level of the bottom face of the other buried gate trench 8b. The second impurity diffusion layer (source region) 14b is formed by diffusing an impurity into the other of the two second active regions 6a, 6c located on the opposite sides of the first active region 6b (active region 6c), to a depth equivalent to the level of the top of the other gate electrode 7b.

In the other transistor Tr2, a channel S2 is formed on the two faces of the trench 8b, namely the bottom face and the side face on which the second impurity region 14b is formed, except the region where the first and second impurity diffusion layers 13b, 14b are formed. In other words, the first active region 6b and the other second active region 6c respectively have side portions facing to each other across the channel layer located therebetween, and the channel S2 is formed on the side portion of the second active region 6c and the top of the channel layer.

This makes it possible to reduce the channel resistance in comparison, for example, with the related semiconductor device shown in FIG. 23B in which the channel S2' is formed on the three faces, namely the opposite side faces and the bottom face of the buried gate trench 106b. Therefore, sufficient ON current of the one transistor Tr2 can be ensured.

In the semiconductor device 1C according to the invention, neither the channel S1 nor the channel S2 is formed on the side faces of the buried gate trenches 8a, 8b on which the first impurity diffusion layers 13a, 13b are formed. The insulating film 12 is buried in the bit contact trench 11A that is formed deeper than the buried gate trenches 8a, 8b, so that insulating film 12 has such a thickness that the top face thereof is located at a higher level than the bottom faces of the buried gate trenches 8a, 8b. Therefore, the semiconductor device 1C can be prevented from occurrence of interference of operation between the two selection transistors Tr1, Tr2 provided side by side in one semiconductor region 6.

This means that it is possible to prevent electrons induced in the channel region (channel S1 or S2) in one of the adjacent transistors Tr1 (Tr2) from moving to the channel region (channel S2 or S1) of the other transistor Tr2 (Tr1). Therefore, the semiconductor device 1C is able to prevent the interference between the adjacent two transistors Tr1, Tr2 when they are operated, and to improve the reliability remarkably.

The semiconductor device 1C according to the invention has bit wiring layers (bit lines) BL connected in common to the first impurity diffusion layers 13a, 13b formed on the opposite side faces of the bit contact trench 11A via the bit contact plug 17, and capacitors Ca1, Ca2 connected to the second impurity diffusion layers 14a, 14b via the capacity contact plugs 20a, 20b, whereby DRAM memory cells MC1, MC2 are formed of the two transistors Tr1, Tr2 arranged in one semiconductor region 6 and the capacitors Ca1, Ca2 connected the respective transistors Tr1, Tr2.

This configuration is able to prevent occurrence of disturb error caused by the state of memory in one of the adjacent memory cells MC1 (MC2) being changed according to an operating state of the other memory cell MC2 (MC1).

For example, data of "0" is stored in one of the two memory cells MC1, MC2 arranged in one semiconductor region 6, that is, in the memory cell MC1, while data of "1" is stored in the other memory cell MC2. According to the invention, even if ON/OFF operation is repeatedly performed on the transistor Tr1 of the memory cell MC1, occurrence of a disturb error, such as the data stored in the memory cell MC2 being destroyed, can be avoided.

In the first place, data of "0" is stored in the memory cell MC1. Specifically, one of the transistors (transistor Tr1) is turned ON while a low-level potential is applied to the bit line BL. Thus, the low-level potential is applied to the lower electrode 21 of one of the capacitors (Ca1). After that, the transistor Tr1 is turned OFF, whereby data of "0" (low-level) is accumulated in the capacitor Ca1.

Next, data of "1" is stored in the other memory cell MC2. Specifically, the other transistor Tr2 is turned ON while a high-level potential is applied to the bit line BL. Thus, the high-level potential is applied to the lower electrode 21 of the other capacitor Ca2. After that, the other transistor Tr2 is turned OFF, whereby data of "1" (high-level data) is accumulated in the other capacitor Ca2.

It is assumed that in this state the same operation is repeated on the memory cell MC1 arranged in another semiconductor region 6 using the same word line WL1 with the memory cell MC1. In this manner, the ON/OFF operation is repeated on one of the transistors (Tr1) whereby a high-level potential is repeatedly applied to the word line WL1.

As described above, it is possible to prevent electrons induced in the channel region (S1) of the one transistor Tr1 from moving to the channel region (S2) of the other transistor Tr2. Therefore, it is possible to prevent the occurrence of a disturb error in which data of "1" (high level data) accumulated in the capacitor Ca2 is rewritten to data of "0" (low level data).

The semiconductor device 1C according to the invention, as described above, is able to normally operate the DRAM even if the distance between the two memory cells MC1, MC2 arranged in one semiconductor region 6 is reduced due to the size reduction of the memory cells, and hence the reliability thereof can be improved significantly.

(Manufacturing Method of Semiconductor Device)

A manufacturing method of the semiconductor device 1C will be described with reference to FIGS. 16A to 16G.

FIGS. 16A to 16G sequentially show manufacturing processes different from those of manufacturing the semiconductor device 1A, and are cross-sectional views of the respective processes, taken along the line A-A' of FIG. 1.

Figure 16A:
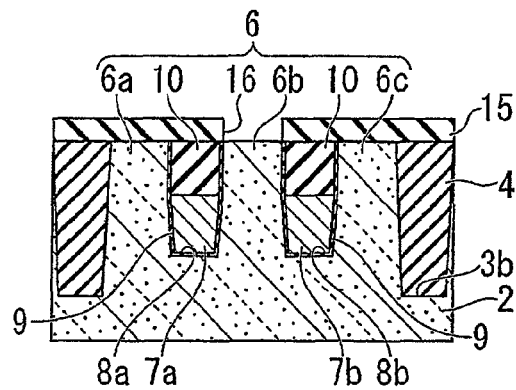
FIG. 16A is a cross-sectional view for explaining a manufacturing process of the semiconductor device according to the second embodiment.

The manufacturing processes until the state shown in FIG. 16A is obtained are basically the same as the manufacturing processes of the semiconductor device 1A described above with reference to FIGS. 3A to 9D, and hence description thereof will be omitted.

However, in the manufacture of the semiconductor device 1C, as shown in FIG. 16A, the buried gate trenches 8a, 8b are formed such that they have a constant width from the surface 2a of the semiconductor substrate 2 up to a midway position in a depth direction and then such that the width is gradually reduced from the midway position toward the bottom faces.

Figure 16B:
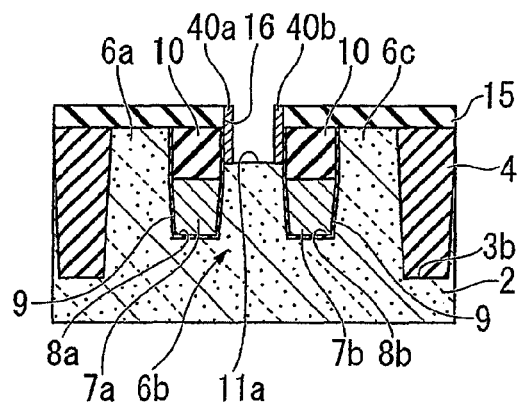
FIG. 16B is a cross-sectional view for explaining the manufacturing process of the semiconductor device according to the second embodiment.

As shown in FIG. 16B, the surface layer of the semiconductor substrate 2 is patterned by anisotropic dry etching using the mask layer 32 (first interlayer insulating film 15), so that a trench 11a having a constant width is formed in the surface layer of the semiconductor substrate 2. Subsequently, a pair of sidewall insulating films 40a, 40b are formed to cover the opposite side faces of the trench 11a.

When forming the pair of sidewall insulating films 40a, 40b, a silicon nitride film is formed to cover the surface of the semiconductor substrate 2. This silicon nitride film is formed to have such a thickness that the inside of the trench 11a is not completely filled therewith. The silicon nitride film is then etched back by anisotropic dry etching such that silicon nitride film is left only on the side faces of the trench 11a. In this manner, the pair of sidewall insulating films 40a, 40b can be formed, covering the opposite side faces of the trench 11a.

Figure 16C:
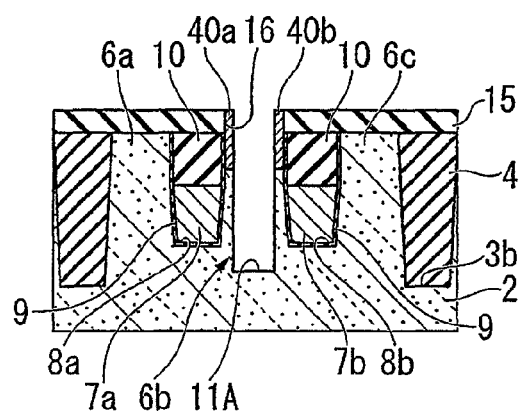
FIG. 16C is a cross-sectional view for explaining the manufacturing process of the semiconductor device according to the second embodiment.

Next, as shown in FIG. 16C, the bottom face of the trench 11a is patterned by anisotropic dry etching according to the width between the pair of sidewall insulating films 40a, 40b, so that a bit contact trench 11A is formed.

Figure 16D:
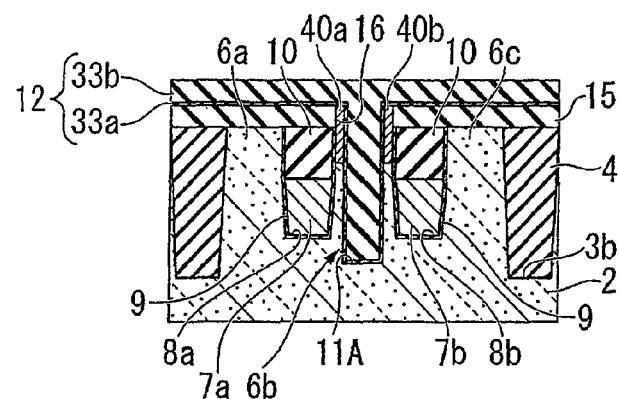
FIG. 16D is a cross-sectional view for explaining the manufacturing process of the semiconductor device according to the second embodiment.

Next, as shown in FIG. 16D, a liner insulating film 33a is formed to cover the surface of the bit contact trench 11A, and then a buried insulating film 33b is formed in the inside of bit contact trench 11A. The liner insulating film 33a may be, for example, a silicon oxide film formed by a CVD method. The buried insulating film 33b may be, for example, a boron phosphorus silicon glass (BPSG) film, a spin-on dielectrics (SOD) film, or a fluorine-doped silicon oxide (SiOF) film. The liner insulating film 33a and the buried insulating film 33b are etched back by anisotropic dry etching, whereby an insulating film 12 having a predetermined thickness can be formed in the bit contact trench 11A. The face of the buried insulating film 12 is located at a higher level than the top face of the channel regions, while the bottom face is located at a lower level than the top face of the channel regions.

Figure 16E:
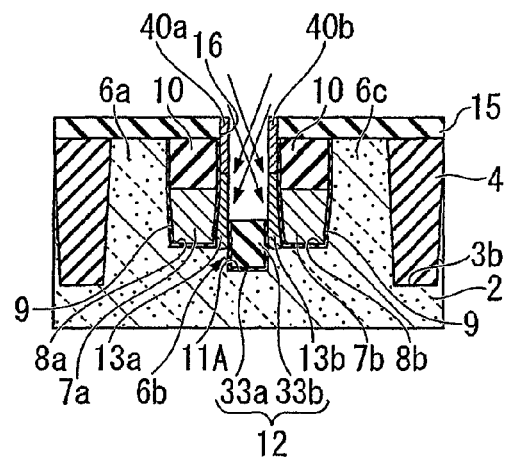
FIG. 16E is a cross-sectional view for explaining the manufacturing process of the semiconductor device according to the second embodiment.

Next, as shown in FIG. 16E, impurity ions are introduced in an oblique directions to the opposite side faces (first sides) of the bit contact trench 11A, whereby a first impurity diffusion layer 13 (13a, 13b) is formed. The impurity may be phosphorus or other N-type impurity, and can be introduced by ion implantation at a predetermined concentration. The ion implantation is performed to the opposite side faces of the bit contact trench 11, oblique to the first direction X' and second direction Y. Thus, first impurity diffusion layers 13a, 13b having an impurity diffused therein are formed under the pair of sidewall insulating films 40a, 40b, to a depth equivalent to the level of the bottom faces of the buried gate trenches 8a, 8b.

Figure 16F:
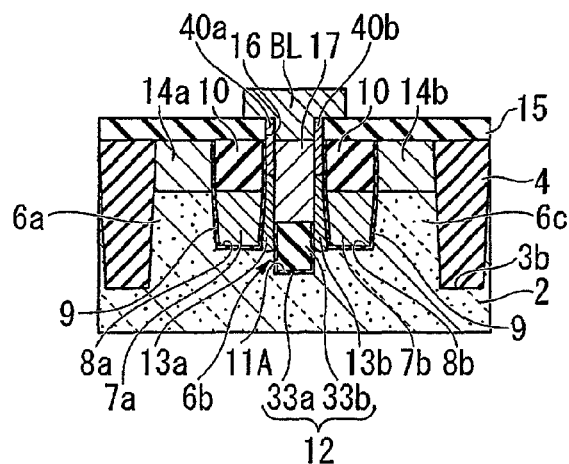
FIG. 16F is a cross-sectional view for explaining the manufacturing process of the semiconductor device according to the second embodiment.

Next, as shown in FIG. 16F, second impurity diffusion layers 14a, 14b, a bit contact plug 17, and a bit wiring layer BL are formed in the same manner as in the processes shown in FIGS. 12A to 13D. The subsequent processes are basically the same as those of the semiconductor device 1A, and hence description thereof will be omitted.

The semiconductor device 1C as shown in FIG. 15 can be manufactured by the steps as described above.

According to the invention as described above, ON current of the aforementioned transistors Tr1, Tr2 can be ensured sufficiently, and even if the distance between the two memory cells MC1, MC2 arranged in one semiconductor region 6 is reduced due to size reduction of the memory cells, occurrence of disturb error can be prevented, and normal operation of the DRAM can be ensured. Thus, the semiconductor device 1C having high reliability can be manufactured appropriately.

The invention is not necessarily limited to the second embodiment, but may be modified in various manners without departing from the scope of the invention.

Figure 17A:
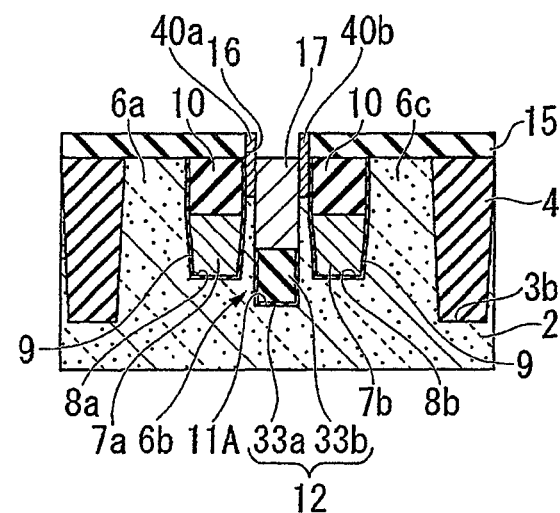
FIG. 17A is a cross-sectional view for explaining another method of forming the first impurity diffusion layer.
Figure 17B:
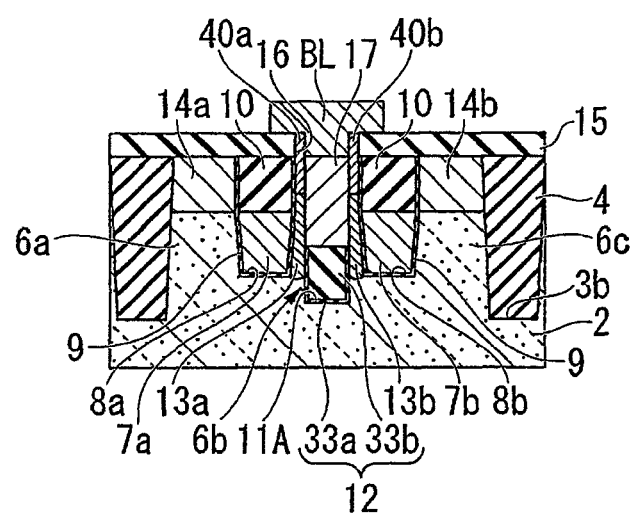
FIG. 17B is a cross-sectional view for explaining still another method of forming the first impurity diffusion layer.

For example, when forming the first impurity diffusion layers 13a, 13b, an impurity-doped polysilicon (DOPOS) film may be buried and formed as the bit contact plug 17 after the insulating film 12 is buried in the inside of the bit contact trench 11A, as shown in FIG. 17A, instead of performing oblique ion implantation to the opposite side faces of the bit contact trench 11A as shown in FIG. 16E. After that, as shown in FIG. 17B, the first impurity diffusion layers 13a, 13b can be formed by diffusing the impurity contained in the DOPOS film into the opposite side faces of the bit contact trench 11A.

(Modification 2-1)

Figure 18:
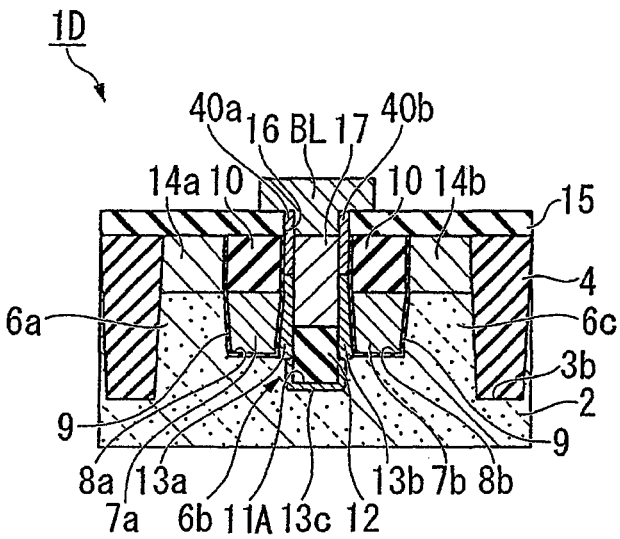
FIG. 18 is a cross-sectional view showing a modification of the semiconductor device according to the second embodiment.

For example, like the semiconductor device 1D shown in FIG. 18, a configuration may be employed in which first impurity diffusion layers 13a, 13b, 13c are formed to cover the regions from the opposite side faces to the bottom face of the bit contact trench 11A. This means that, the semiconductor device 1D has a configuration in which the first impurity diffusion layers 13a, 13b formed on the opposite side faces of the bit contact trench 11 are joined to the first impurity diffusion layer 13c formed on the bottom face of the trench 11A.

When forming these first impurity diffusion layers 13a, 13b, 13c, a BPSG film may be used as the insulating film 12, so that an impurity contained in this BPSG film is diffused into the opposite side faces and the bottom face of the bit contact trench 11. It is also possible to employ a method in which oblique ion implantation is performed to the opposite side faces and the bottom face of the bit contact trench 11 after formation of the bit contact trench 11A, and then an insulating film 12 is formed to be buried in the bit contact trench 11A. These methods may be employed in combination.

The semiconductor device 1D also may assume a configuration other than the one described above, like the semiconductor device 1C. Therefore, description of such other configuration will be omitted and like components are assigned with like reference numerals in the drawings.

In the semiconductor device 1D having the configuration described above, no channel S1, S2 is formed on the side faces of the buried gate trenches 8a, 8b on which first impurity diffusion layers 13a, 13b are formed. Further, a first impurity diffusion layer 13c is formed on the bottom face of the bit contact trench 11A which is formed deeper than the buried gate trenches 8a, 8b. An insulating film 12 is buried in this trench 11A in such a thickness that the top face thereof is located above the bottom faces of the buried gate trenches 8a, 8b. Like in the semiconductor device 1C, this configuration is able to prevent occurrence of interference in operation between the two transistors Tr1, Tr2 arranged side by side in one semiconductor region 6.

(Modification 2-2)

Figure 19:
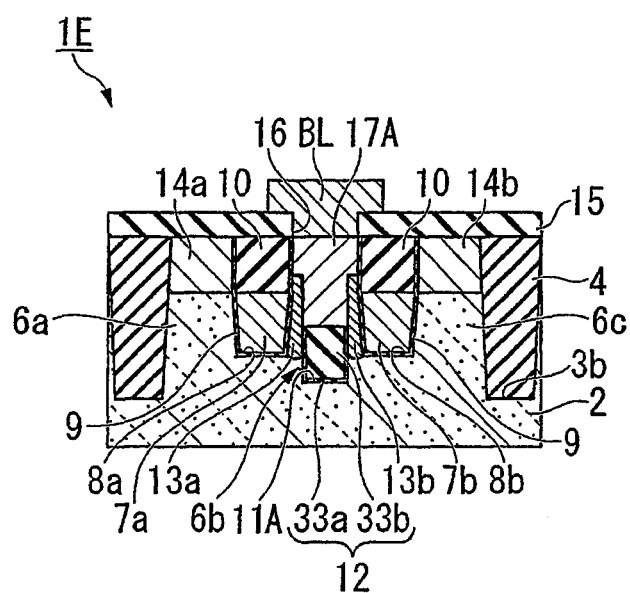
FIG. 19 is a cross-sectional view showing a modification of the semiconductor device according to the second embodiment.

A configuration is also possible, like a semiconductor device 1E shown in FIG. 19, in which the pair of sidewall insulating films 40a, 40b are removed. Specifically, in this semiconductor device 1E, a bit contact plug 17A buried in the bit contact trench 11A is formed after the sidewall insulating films 40a, 40b are removed. This provides a configuration in which the bit contact plug 17A is electrically connected not only to the side faces of the first impurity diffusion layers 13a, 13b but also to the upper ends thereof.

The semiconductor device 1E also may assume a configuration other than the one described above, like the semiconductor device 1C. Therefore, description of such other configuration will be omitted and like components are assigned with like reference numerals in the drawings.

In the semiconductor device 1E having the configuration described above, no channel S1, S2 is formed on the side faces of the buried gate trenches 8a, 8b on which first impurity diffusion layers 13a, 13b are formed. Further, a first impurity diffusion layer 13c is formed on the bottom face of the bit contact trench 11A which is formed deeper than the buried gate trenches 8a, 8b. An insulating film 12 is buried in this trench 11A in such a thickness that the top face thereof is located above the bottom faces of the buried gate trenches 8a, 8b. Like in the semiconductor device 1C, this configuration is able to prevent occurrence of interference in operation between the two transistors Tr1, Tr2 arranged side by side in one semiconductor region 6.

(Modification 2-3)

Figure 20:
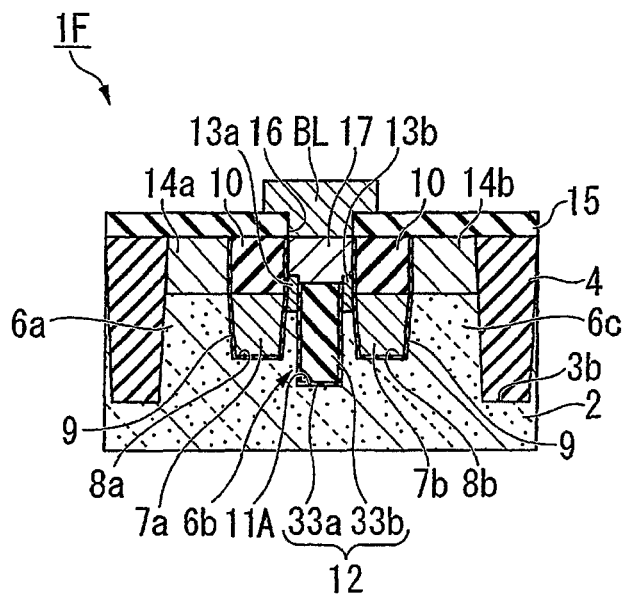
FIG. 20 is a cross-sectional view showing a modification of the semiconductor device according to the second embodiment.

A configuration is also possible, like a semiconductor device 1F shown in FIG. 20, in which a pair of sidewall insulating films 40a, 40b are removed, a DOPOS film is buried and formed as the bit contact plug 17, and then first impurity diffusion layers 13a, 13b are formed by diffusing the impurity contained in the DOPOS film into the opposite side faces of the bit contact trench 11A.

The semiconductor device 1F also may assume a configuration other than the one described above, like the semiconductor device 1C. Therefore, description of such other configuration will be omitted and like components are assigned with like reference numerals in the drawings.

In the semiconductor device 1F having the configuration described above, no channel S1, S2 is formed on the side faces of the buried gate trenches 8a, 8b on which first impurity diffusion layers 13a, 13b are formed. Further, a first impurity diffusion layer 13c is formed on the bottom face of the bit contact trench 11A which is formed deeper than the buried gate trenches 8a, 8b. An insulating film 12 is buried in this trench 11A in such a thickness that the top face thereof is located above the bottom faces of the buried gate trenches 8a, 8b. Like in the semiconductor device 1C, this configuration is able to prevent occurrence of interference in operation between the two transistors Tr1, Tr2 arranged side by side in one semiconductor region 6.

(Modification 2-4)

Figure 21:
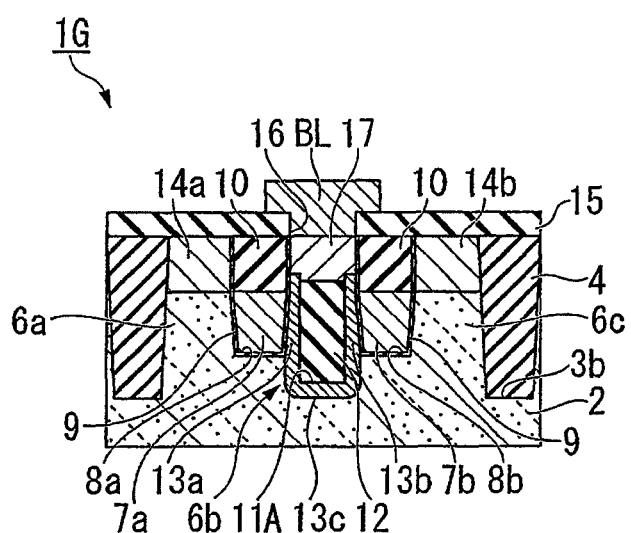
FIG. 21 is a cross-sectional view showing a modification of the semiconductor device according to the second embodiment.

Further, according to the invention, a configuration is also possible, like a semiconductor device 1G shown in FIG. 21, in which a pair of sidewall insulating films 40a, 40b are removed, a BPSG film as the insulating film 12 and a DOPOS film as the bit contact plug 17 are sequentially buried and formed, and then the impurity contained in the BPSG film and the DOPOS film are diffused into the opposite side faces and the bottom face of the bit contact trench 11A, so that first impurity diffusion layers 13a, 13b, 13c are formed over a region from the opposite side faces to the bottom face of the bit contact trench 11A.

The semiconductor device 1G also may assume a configuration other than the one described above, like the semiconductor device 1C. Therefore, description of such other configuration will be omitted and like components are assigned with like reference numerals in the drawings.

In the semiconductor device 1G having the configuration described above, no channel S1, S2 is formed on the side faces of the buried gate trenches 8a, 8b on which first impurity diffusion layers 13a, 13b are formed. Further, a first impurity diffusion layer 13c is formed on the bottom face of the bit contact trench 11A which is formed deeper than the buried gate trenches 8a, 8b. An insulating film 12 is buried in this trench 11A in such a thickness that the top face thereof is located above the bottom faces of the buried gate trenches 8a, 8b. Like in the semiconductor device 1C, this configuration is able to prevent occurrence of interference in operation between the two transistors Tr1, Tr2 arranged side by side in one semiconductor region 6.

(Data Processing System)

Figure 22:
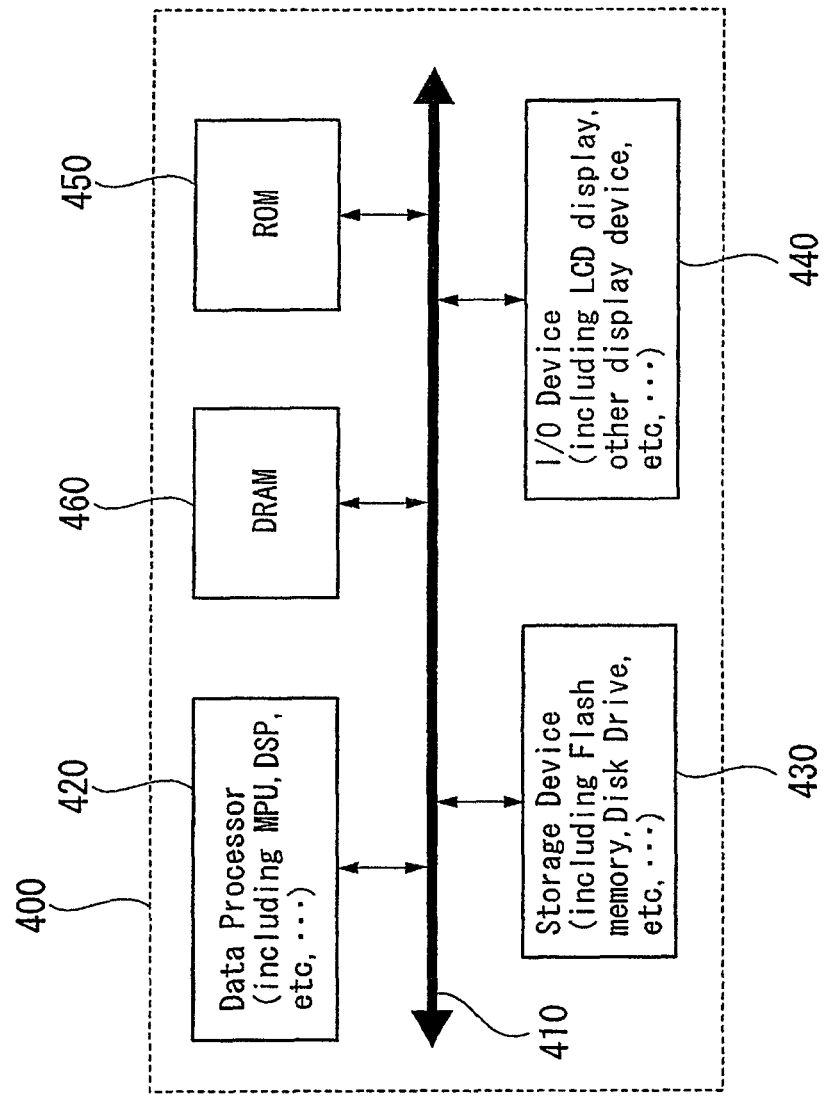
FIG. 22 is a block diagram showing a configuration of a data processing system including a semiconductor device according to the invention.

Next, a data processing system 400 according to the invention shown in FIG. 22 will be described.

The data processing system 400 according to the invention is an example of a system having any one of the semiconductor devices 1A to 1G described above, and this data processing system 400 may be, but not limited to, a computer system.

The data processing system 400 includes a data processor 420 and a DRAM 460 that is a semiconductor device according to the invention. The data processor 420 may be, but not limited to, a microprocessor (MPU), or a digital signal processor (DPS).

The data processor 420 is connected to the DRAM 46 via a system bus 410, but may be connected by a local bus without the system bus 410. Although one system bus 410 is shown in FIG. 22, the system bus 410 may be connected in series or in parallel as necessary via a connector or the like.

In this data processing system 400, a storage device 430, an I/O device 440, and a ROM 450 are connected to the system bus 410 as required, these are not necessarily essential components. The I/O device 440 as used herein may be only either an input device or an output device. The number of each component is not limited particularly, and may be at least one or more.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A device comprising:
a first transistor having a first pillar-shaped semiconductor portion, a first vertical channel portion, a first horizontal channel portion and a first diffusion region, the first vertical channel portion and the first horizontal channel portion being arranged in a first direction and connected to each other to form an L-shaped channel, the first horizontal channel portion and the first diffusion region being arranged in the first direction and connected to each other, a first lower boundary of the first diffusion region being at a lower level than an first upper boundary of the first horizontal channel portion;
a first gate electrode covering a side portion of the first vertical channel portion and a top surface of first horizontal channel portion of the first transistor, the first gate electrode extending in a second direction that is substantially perpendicular to the first direction, the first gate electrode having a first top surface which is at a lower level than a top of the first pillar-shaped semiconductor portion; and
a contact plug being electrically connected to the first diffusion region, a lowest portion of the contact plug being at a lower level than the top surface of the first gate electrode, an upper portion of the contact plug being connected to a wiring layer, the wiring layer being at a level higher than a top surface of the first pillar-shaped semiconductor portion.

2. The device according to claim 1, further comprising:
a second transistor having a second pillar-shaped semiconductor portion, a second vertical channel portion, a second horizontal channel portion and a second diffusion region, the second vertical channel portion and the second horizontal channel portion being arranged in the first direction and connected to each other to form an L-shaped channel, the second horizontal channel portion and the second diffusion region being arranged in the first direction and connected to each other, the first diffusion region of the first transistor and the second diffusion region of the second transistor being arranged in the first direction and electrically connected to each other, a second lower boundary of the second diffusion region being at a lower level than a second upper boundary of the second horizontal channel portions; and
a second gate electrode covering a side portion of the second vertical channel portion and a top surface of second horizontal channel portion, the second gate electrode extending in the second direction, the second gate electrode having a top surface which is at a lower level than a top of the second pillar-shaped semiconductor portion, wherein
the contact plug is electrically connected to the second diffusion region and intervenes between the first and the second diffusion regions, a lowest portion of the contact plug being at a lower level than the top surface of the second gate electrode.

3. The device according to claim 2, wherein
the device is a memory device,
a data storage element is connected to an upper portion of the first pillar-shaped semiconductor portion, and
the first transistor and the second transistor are selection transistors.

4. The device according to claim 2, wherein the contact plug at least contacts a sidewall of the first diffusion layer and a sidewall of the second diffusion layer.

* * * * *